(12) United States Patent
Gorbachov et al.

(10) Patent No.: US 10,396,833 B2
(45) Date of Patent: Aug. 27, 2019

(54) ACTIVE HARMONIC FILTERS FOR INTEGRATED RADIO FREQUENCY AMPLIFIERS

(71) Applicant: Skyworks Solutions, Inc., Woburn, MA (US)

(72) Inventors: Oleksandr Gorbachov, Irvine, CA (US); Lisette L. Zhang, Irvine, CA (US); Lothar Musiol, Irvine, CA (US)

(73) Assignee: Skyworks Solutions, Inc., Woburn, MA (US)

( * ) Notice: Subject to any disclaimer, the term of this patent is extended or adjusted under 35 U.S.C. 154(b) by 0 days.

(21) Appl. No.: 16/154,313

(22) Filed: Oct. 8, 2018

(65) Prior Publication Data

US 2019/0044554 A1 Feb. 7, 2019

Related U.S. Application Data

(62) Division of application No. 15/370,943, filed on Dec. 6, 2016, now Pat. No. 10,097,216.

(60) Provisional application No. 62/264,484, filed on Dec. 8, 2015.

(51) Int. Cl.
*H03F 3/24* (2006.01)
*H04B 1/04* (2006.01)
*H04B 1/10* (2006.01)
*H04B 15/00* (2006.01)

(52) U.S. Cl.
CPC ................. *H04B 1/04* (2013.01); *H03F 3/24* (2013.01); *H04B 1/1036* (2013.01); *H04B 15/00* (2013.01); *H04B 2001/0408* (2013.01)

(58) Field of Classification Search
CPC ........ H04B 1/04; H04B 1/1036; H04B 15/00; H04B 2001/0408; H03F 3/24
See application file for complete search history.

(56) References Cited

U.S. PATENT DOCUMENTS

| | | | |
|---|---|---|---|
| 4,147,997 A | 4/1979 | Greaves | |
| 5,598,123 A | 1/1997 | Desne | |
| 10,097,216 B2 * | 10/2018 | Gorbachov | .............. H04B 1/04 |
| 2001/0022528 A1 | 9/2001 | Houghton et al. | |
| 2006/0044850 A1 | 3/2006 | Wu et al. | |
| 2008/0129424 A1 | 6/2008 | Golden et al. | |
| 2013/0331048 A1 * | 12/2013 | Tombak | .............. H03F 3/45076 455/127.2 |
| 2014/0197892 A1 | 7/2014 | Gorbachov | |
| 2015/0236671 A1 | 8/2015 | Smith et al. | |

OTHER PUBLICATIONS

PCT Search Report & Written Opinion for PCT/US2016/065398; dated Apr. 10, 2017.

* cited by examiner

*Primary Examiner* — Nguyen T Vo
(74) *Attorney, Agent, or Firm* — Stetina Brunda Garred & Brucker

(57) ABSTRACT

A radio frequency front end circuit includes an output signal transmission line, an amplifier circuit with an input connected to a radio frequency signal source and an output connected to the output signal transmission line. A harmonic suppression circuit is connected to the amplifier circuit, and includes an active circuit element having a frequency-dependent impedance and is tuned as a reflective trap with a negative capacitance for one or more rejection frequency ranges each corresponding to a multiple of a fundamental frequency of a signal generated by the radio frequency signal source.

21 Claims, 36 Drawing Sheets

ACTIVE HARMONIC FILTERS FOR INTEGRATED RADIO FREQUENCY AMPLIFIERS

CROSS-REFERENCE TO RELATED APPLICATIONS

The application is a divisional patent application of U.S. patent application Ser. No. 15/370,943 filed Dec. 6, 2016 and entitled "ACTIVE HARMONIC FILTERS FOR INTEGRATED RADIO FREQUENCY POWER AMPLIFIERS," which relates to and claims the benefit under 35 U.S.C. § 119(e) to U.S. Provisional Patent Application No. 62/264,484 filed Dec. 8, 2015 and entitled "ACTIVE HARMONIC FILTERS FOR INTEGRATED RF POWER AMPLIFIERS," the entire contents of each of which are wholly incorporated by reference herein.

STATEMENT RE: FEDERALLY SPONSORED RESEARCH/DEVELOPMENT

Not Applicable

BACKGROUND

1. Technical Field

The present disclosure relates generally to radio frequency (RF) circuits, and more particularly, active harmonic filters for integrated RF power amplifiers.

2. Related Art

Wireless communications systems find application in numerous contexts involving data transfer over long and short distances alike, and there exists a wide range of modalities suited to meet the particular needs of each. Fundamentally, wireless communications involve a radio frequency (RF) carrier signal that is variously modulated to represent data, and the modulation, transmission, receipt, and demodulation of the signal conform to a set of standards for coordination of the same. Many different mobile communication technologies or air interfaces exist, and various generations of these technologies are deployed in phases.

A fundamental component of any wireless communications system is the transceiver, that is, the combined transmitter and receiver circuitry. The transceiver encodes the data to a baseband signal and modules it with an RF carrier signal. Upon receipt, the transceiver down-converts the RF signal, demodulates the baseband signal, and decodes the data represented by the baseband signal. An antenna connected to the transmitter converts the electrical signals to electromagnetic waves, and an antenna connected to the receiver converts the electromagnetic waves back to electrical signals. A communications link is established when both the transmission and reception of a signal are in accordance with mutual parameters.

Transceivers typically do not generate sufficient power or have sufficient sensitivity for reliable communications standing alone. Thus, additional conditioning of the RF signal at both the transmission end and the reception end is necessary. The circuitry between the transceiver and the antenna that provide this functionality is referred to as the front end, which includes a power amplifier for increased transmission power, and/or a low noise amplifier for increased reception sensitivity. The front end also includes a switch circuit that selectively interconnects the power amplifier and the low noise amplifier to the antenna.

In an actual implementation, the RF power amplifier exhibits some degree of non-linearity in the amplification of the radio frequency carrier signal. This results in harmonics, which are integer multiples of the fundamental operating frequency, being generated. These emissions outside the designated operating frequency are undesirable, as they have the potential to interfere with other wireless systems. Accordingly, there are various regulatory requirements that govern the acceptable spurious emission levels in end products to ensure that different communications devices can co-exist and function properly within the same vicinity. These restrictions are imposed on each of the constituent components, including the transceiver and the front end Conventional RF power amplifiers thus incorporate harmonic filters to minimize the level of undesirable emissions. One possible way to reduce harmonic emissions is by way of a low-pass filter that rejects all frequencies above the fundamental frequency, while another possibility is a notch filter that rejects only certain harmonics as defined by the particular communications standard. In order for the filter to be able to reject high levels of harmonic frequencies, components having low loss such as capacitors and inductors are utilized. On-die harmonics suppression filters are insufficient, as the achievable performance is limited to the components that can be fabricated thereon. Capacitors with high capacitance values and inductors with high inductance values are challenging to fabricate on-die due to their larger footprints, and attendant increases in cost.

Thus, external filter circuits may be added to prevent strong harmonic signals to reach the antenna, either at the module level, e.g., as a separate circuit element that is packaged together with the RF switch, power amplifier, and low noise amplifier, or at the printed circuit board level, e.g., as a separate component and package mounted to the printed circuit board and interconnected with conductive traces between the pin outs of the separate packages. External filters, however, are expensive, require additional space, and introduce additional transmission path losses.

Accordingly, there is a need in the art for harmonic rejection filters with sufficient rejection levels to meet and exceed stringent spurious emissions limits. There is also a need in the art for harmonic rejection filters that may be implemented on-die without substantial increases in die footprint. It would also be desirable for such filters to consume minimal power, with less loss, and higher harmonic suppression than passive traps.

BRIEF SUMMARY

One embodiment of the present disclosure is directed to an active filter that is connectible to a transmission line from an output of an amplifier for reducing harmonics of a signal being amplified thereby. The active filter may include an operational amplifier with an inverting input, a non-inverting input, and a single-ended output. Additionally, there may be a resistor network connected to the non-inverting input and to the single-ended output. There may also be a first inductive-capacitive element that is connected to the inverting input and to the single-ended output. The first inductive-capacitive element may define a first rejection frequency notch corresponding to an inductance and a capacitance of the first inductive-capacitive element. The active filter may also include a filter circuit interface node defined at a junction of the first inductive-capacitive element to which the transmission line is connectible. The filter circuit interface node may have a frequency-dependent negative capacitance corresponding to a low frequency gain of the operational amplifier, half power point bandwidth of the operational amplifier, and output impedance as defined by the resistor network and the first inductive-capacitive element connected thereto.

According to another embodiment of the present disclosure, there is an active filter that is also connectible to an amplifier for reducing harmonics of a signal being amplified thereby. The active filter may have a single port that is connectible to the amplifier. Additionally, there may be a first differential amplifier circuit defining a first negative capacitance at a first predetermined operating frequency range. The first differential amplifier circuit may include a first pair of transistors and a second pair of transistors. Each transistor in the first pair may be connected to a respective one of the transistors in the second pair to define a corresponding inverting differential circuit segment and a non-inverting differential circuit segment. The inverting differential circuit segment and the non-inverting differential segment may be interconnected with one or more passive circuit elements at corresponding circuit junctions. At least one of these circuit junctions may be connected to the single port. The active filter may also include a first tank circuit having a first port that is connectible to the amplifier and a second port that is connected to the single port. The first tank circuit together with the first negative capacitance of the first differential amplifier may define a first harmonic trap for reflecting the harmonics of the signal to block upstream passage thereof.

Still another embodiment of the present disclosure is a radio frequency front end circuit. There may be an output signal transmission line, as well as an amplifier circuit with an input connected to a radio frequency signal source and an output connected to the output signal transmission line. The front end circuit may include a harmonic suppression circuit connected to the amplifier circuit. Furthermore, the harmonic suppression circuit may include an active circuit element having a frequency-dependent impedance and may be tuned as a reflective trap with a negative capacitance for one or more rejection frequency ranges each corresponding to a multiple of a fundamental frequency of a signal generated by the radio frequency signal source.

The present disclosure also contemplates a radio frequency communications module with the aforementioned active filter, as well as a wireless communications device that incorporates such an active filter. The present disclosure will be best understood by reference to the following detailed description when read in conjunction with the accompanying drawings.

BRIEF DESCRIPTION OF THE DRAWINGS

These and other features and advantages of the various embodiments disclosed herein will be better understood with respect to the following description and drawings, in which like numbers refer to like parts throughout, and in which.

DETAILED DESCRIPTION

The detailed description set forth below in connection with the appended drawings is intended as a description of the several presently contemplated embodiments of active harmonic filters and radio frequency amplifiers utilizing the same, and are not intended to represent the only form in which the disclosed filter circuits may be developed or utilized. The description sets forth the functions and features in connection with the illustrated embodiments. It is to be understood, however, that the same or equivalent functions may be accomplished by different embodiments that are also intended to be encompassed within the scope of the present disclosure. It is further understood that the use of relational terms such as first and second and the like are used solely to distinguish one from another entity without necessarily requiring or implying any actual such relationship or order between such entities.

Figure 1:
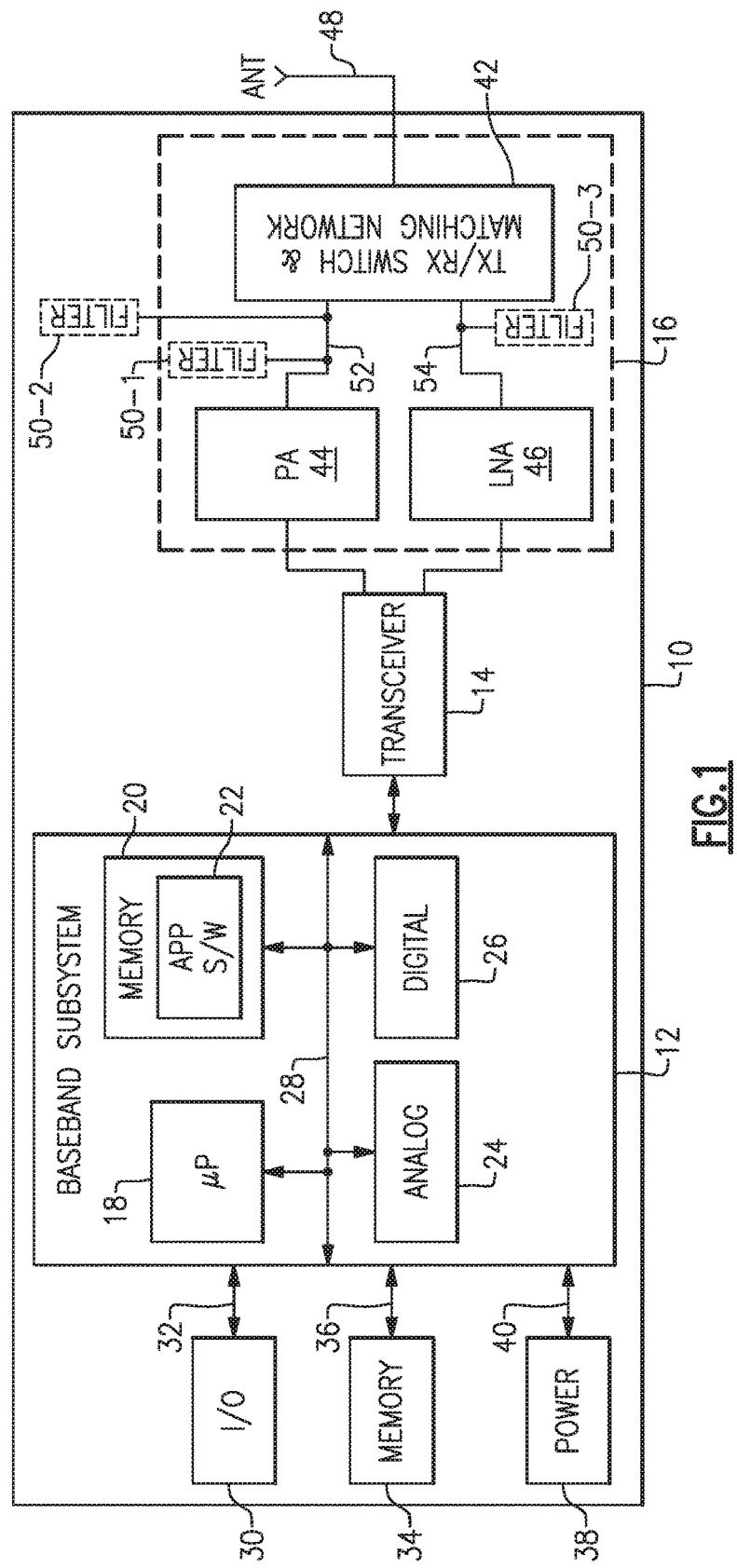
FIG. 1 a block diagram of an exemplary wireless communications device that may incorporate an active harmonic filter in accordance with the present disclosure.

FIG. 1 illustrates a simplified wireless communications device 10 in which various embodiments of the active filters in accordance with the present disclosure may be incorporated. In various embodiments, the wireless communications device 10 can be a cellular telephone. However, the low noise amplifier circuit may be utilized in any wireless device with signal reception capabilities. The wireless communications device 10 illustrated in FIG. 1 is intended to be a simplified example of a cellular telephone and to illustrate one of many possible applications in which the low noise amplifier circuit can be implemented. One having ordinary skill in the art will understand the operation of a cellular telephone, and, as such, implementation details are omitted.

The wireless communications device 10 includes a baseband subsystem 12, a transceiver 14, and a front end module 16. Although omitted from FIG. 1, the transceiver 14 includes modulation and upconversion circuitry for preparing a baseband information signal for amplification and transmission, and includes filtering and downconversion circuitry for receiving and downconverting a radio frequency signal to a baseband information signal to recover data. The details of the operation of the transceiver 14 are known to those skilled in the art.

The baseband subsystem 12 generally includes a processor 18, which can be a general purpose or special purpose microprocessor, memory 20, application software 22, analog circuit elements 24, and digital circuit elements 26, connected over a system bus 28. The system bus 28 can include the physical and logical connections to couple the above-described elements together and enable their interoperability.

An input/output (I/O) element 30 is connected to the baseband subsystem 12 over a connection 32, a memory element 34 is coupled to the baseband subsystem 12 over a connection 36 and a power source 38 is connected to the baseband subsystem 12 over connection 40. The I/O element 30 can include, for example, a microphone, a keypad, a speaker, a pointing device, user interface control elements, and any other device or system that allows a user to provide input commands and receive outputs from the wireless communications device 10.

The memory 20 can be any type of volatile or non-volatile memory, and in an embodiment, can include flash memory. The memory element 34 can be permanently installed in the wireless communications device 10, or can be a removable memory element, such as a removable memory card.

The power source 38 can be, for example, a battery, or other rechargeable power source, or can be an adaptor that converts AC power to the correct voltage used by the wireless communications device 10. In an embodiment, the power source can be a battery that provides a nominal voltage output of approximately 3.6 volts (V). However, the output voltage range of the power source can range from approximately 3.0 to 6.0 V.

The processor 18 can be any processor that executes the application software 22 to control the operation and functionality of the wireless communications device 10. The memory 20 can be volatile or non-volatile memory, and in an embodiment, can be non-volatile memory that stores the application software 22.

The analog circuit elements 24 and the digital circuit elements 26 include the signal processing, signal conversion, and logic that convert an input signal provided by the I/O element 30 to an information signal that is to be transmitted. Similarly, the analog circuit elements 24 and the digital circuit elements 26 include the signal processing, signal conversion, and logic that convert a received signal provided by the transceiver 14 to an information signal that contains recovered information. The digital circuit elements 26 can include, for example, a Digital Signal Processor (DSP), a Field Programmable Gate Array (FPGA), or any other processing device. Because the baseband subsystem 12 includes both analog and digital elements, it is sometimes referred to as a mixed signal circuit.

The front end module 16 is generally comprised of components belonging to a transmit signal chain, components belonging to a receive signal chain, and a switch 42. For purposes of simplification, the transmit signal chain is generally represented by a power amplifier 44, while the receive signal chain is generally represented by a low noise amplifier 46. The switch 42 interconnects the power amplifier 44 and the low noise amplifier 46 to an antenna 48. The front end module 16 depicted in FIG. 1 is understood to be for a single wireless operating mode, and those having ordinary skill in the art will appreciate that a conventional wireless communications device 10 has multiple wireless operating modes conforming to different standards. Accordingly, there may be multiple front end modules 16 particularly configured for each operating mode, or one front end module 16 with multiple constituent components for each operating mode. Along these lines, these different operating modes may utilize more than one antenna at a time (diversity mode operation), so the single antenna 48 is presented by way of example only and not of limitation.

As mentioned earlier, non-linearity of the power amplifier 44 may result in harmonic components of the fundamental signal being generated thereby and then transmitted by the antenna 48. The harmonic components may result in degraded performance from nearby receivers, and may result in the wireless communications device 10 not meeting regulatory spurious emission limits. In accordance with various embodiments of the present disclosure, an active harmonic filter 50 is introduced into output of the power amplifier 44. As will be described in further detail below, the active harmonic filter 50 is understood to be a single port device that is connected to a transmit signal transmission line 62 from the output of the power amplifier 44 to the switch 42, and ultimately to the antenna 48. In one contemplated embodiment, a first implementation of the active harmonic filter 50-1 may in the front end module 16. Alternatively, as in a second implementation of 50-2, the active harmonic filter may be implemented as a separate component external to the front end module 16.

Although the present disclosure is based upon an implementation in which the active harmonic filter 50 rejects or attenuates harmonics generated by the power amplifier 44, hence being connected to the output of the same, this is by way of example only and not of limitation. Other embodiments are contemplated in which the active harmonic filter 50 is utilized in connection with harmonics of the receive signal from the antenna 48. Accordingly, the active harmonic filter 50-3 can be connected to a receive signal transmission line 62. Although not specifically illustrated, the active harmonic filter 50-3 that is configured for incoming receive signals can likewise be implemented as a separate component external to the front end module 16.

Figure 2:
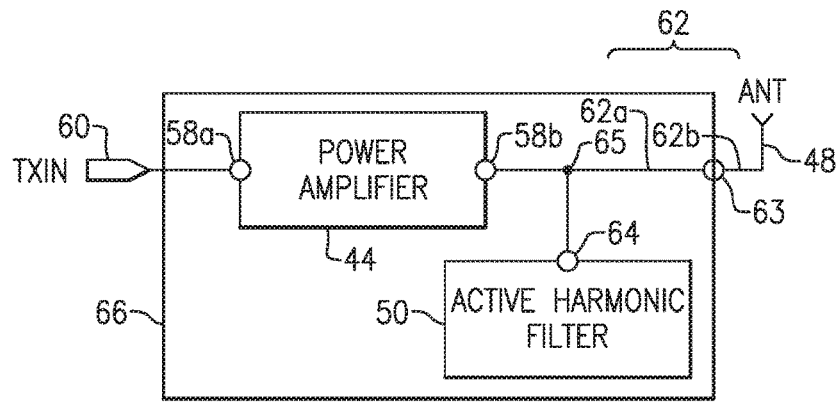
FIG. 2 is a block diagram of an exemplary radio frequency amplifier circuit according to another embodiment of the disclosure.

With reference to the block diagram of FIG. 2, one embodiment of the present disclosure is a front end circuit 56 that includes the power amplifier 44 and the active harmonic filter 50. The power amplifier 44 has an input 58a that is connected to a transmit signal source 60, which is understood to be the transceiver 14. Additionally, the power amplifier 44 has an output 58b, which is connected to the antenna 48 over a transmission line 62. The radio frequency (RF) signal generated by the transceiver 14 is amplified by the power amplifier 44 prior to transmission via the antenna 48. The power amplifier 44 may have any suitable configuration, and the contemplated active harmonic filter 50 is not understood to require that the power amplifier 44 have a specific configuration.

The transmission line 62 may be defined as multiple parts or segments. For instance, there may be a first segment 62a of the transmission line that is within the physical bounds of the front end circuit 56, and thus be implemented as conductive traces on the semiconductor die or as bond wires that electrically connect the corresponding pads on the semiconductor die to contacts. Additionally, there may be a second segment 62b that is exterior to the front end circuit 56 and thus corresponds to a trace on a printed circuit board, a wire, or other conductive element that separates the front end circuit 56 from the antenna 48. In this regard, the front end circuit 56 is understood to have an antenna port 63 to which the antenna 48 is connected. The aforementioned switch 42, however, has been omitted from the block diagram of FIG. 2 for the sake of simplicity, though it is to be understood that the typical embodiment of the front end circuit 56 would include the switch 42 that selectively interconnects the antenna 48 to either the power amplifier 44 or the low noise amplifier 46.

The active harmonic filter 50 is understood to be a single port device, with a first port 64 thereof being connected to the transmission line 62. In the illustrated embodiment, the active harmonic filter 50 is connected to a junction 65 of the transmission line 62, which is within the physical bounds of the front end circuit 56 and is therefore part of the first segment 62a. As will be described in further detail below, the active harmonic filter 50 serves as a reflective trap for signal frequencies that are significantly higher than the fundamental frequency of the transmit signal, e.g., harmonics of the transmit signal. Thus, harmonics are suppressed, so the active harmonic filter 50 may also be referred to as a harmonic suppression circuit in some embodiments. Additionally, it is expressly contemplated that there is minimal loss of the transmit signal as output by the power amplifier 44.

The active harmonic filter 50 includes an active circuit element that has a frequency-dependent impedance. A first embodiment of the active harmonic filter 50 utilizes an operational amplifier, while a second embodiment utilizes a differential amplifier. Both types of circuits are understood to generate a frequency-dependent impedance and are tuned for reflecting the undesirable harmonics. This is understood to block the upstream path of such harmonics to the antenna 48. Each active harmonic filter 50 is tuned for a specific harmonic frequency, and to the extent suppression of multiple harmonic frequencies is involved, multiple active harmonic filters 50 may be connected along the transmission line 62.

Referring to the schematic diagram of FIG. 3, additional details of a first embodiment of the active harmonic filter 50a will now be described. Again, the power amplifier 44 is connected to the transmit signal source 60, with the RF signal being fed to an amplifier element 67. The power amplifier 44 includes an output matching network 68 that impedance matches the amplifier element 67 to the 50Ω antenna 48 and the transmission line 62. The major components of the active harmonic filter 50 and the power amplifier 44 may be part of a power amplifier circuit 66 as delineated in FIG. 3, or be part of the front end circuit 56, or any other component. The aggregation of the active harmonic filter 50 and the power amplifier 44 as the power amplifier circuit 66 is by way of example only and not of limitation, and any suitable grouping or set structure/inter-relationships of the components, e.g., one component being part of another, more broadly defined component, may be substituted without departing from the scope of the present disclosure.

The first embodiment of the active harmonic filter 50a includes an operational amplifier U1, which includes an inverting input 70a, a non-inverting input 70b, and single-ended output 72. The operational amplifier U1 is configured as a negative capacitance circuit, with the inverting input 70a being connected to a first inductive-capacitive element 74, which in turn, is connected to the single-ended output 72. The first inductive-capacitive element 74 includes a capacitor C1 that is connected in series with an inductor L1.

Connected to the non-inverting input 70b is a resistor network 76 with a resistor R2 and a resistor R1. The non-inverting input 70b is connected to a junction 77 between the resistor R1 and the resistor R2. The resistor network 76, and specifically the resistor R1 thereof, is connected to the single-ended output 72. A capacitor C2 is connected to the resistor network 76, specifically the resistor R2 thereof at a junction 78. The capacitor C2 is also connected to the inverting input 70a and the first inductive-capacitive element 74. The junction 78 is tied to ground over an inductor L2, which is understood to be a bond wire and thus having minimal inductance. According to one exemplary embodiment, the inductance value of inductor L2 is 0.5 nH. The combination of the capacitor C2 and the inductor L2 may define a second inductive-capacitive element 80.

The negative capacitance as defined by the operational amplifier U1, is understood to be frequency-dependent. The absolute value of the negative capacitance thus defined is a function of the low frequency gain of the operational amplifier, as well as its half power point (−3 dB) bandwidth, and the output impedance, along with the tuning of the capacitor C1, and the resistors R1 and R2.

The active harmonic filter 50a has a rejection frequency range that corresponds to the set values of the first inductive-capacitive element 74, as well as those of the second inductive-capacitive element 80. That is, the values of the inductor L1 and the capacitor C1 defines a first notch frequency, while the inductor L2 and the capacitor C2 defines a second notch frequency. Both of these notch or rejection frequencies are tuned for overlapping each other, so a high level of rejection of a single rejection frequency may be possible. The impedance of the active harmonic filter 50a is understood to be high, e.g., greater than 1 kΩ, so losses at the fundamental frequency or the base RF signal is contemplated to the minimal. Along these lines, the negative capacitance circuit is understood to convert only the reactive part of the impedance, so no additional noise is introduced to the transmission line 62.

The inverting input 70a, that is, the junction of the first inductive-capacitive element 74 and the second inductive-capacitive element 80, is understood to define a filter circuit interface node 82, as this is tied to the first port 64 of the active harmonic filter 50a. Interconnecting the first port 64 to the filter circuit interface node 82 is a direct current decoupling element 84 including a capacitor C3 in series with an inductor L3. These components are understood to serve direct current (DC) decoupling purposes. Additionally, the inductance and capacitance may be adjusted to fine-tune the response of the active harmonic filter 50a. In accordance with one embodiment, the capacitor L3 has an exemplary value of 1 pF, while the inductor L3 has an exemplary value of 1 nH.

Figure 4A:
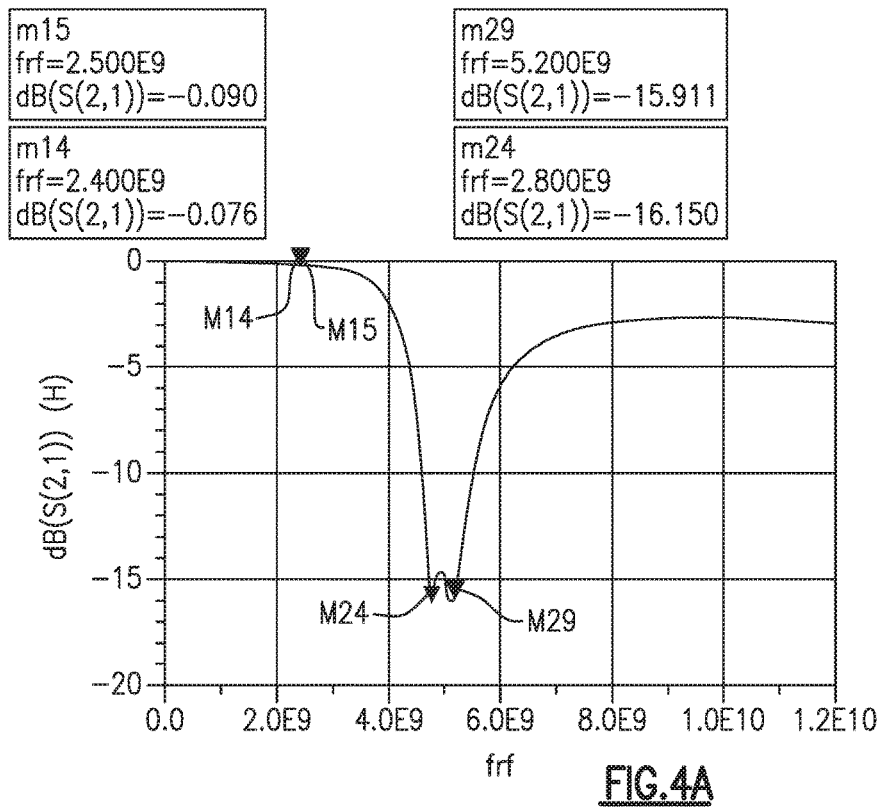
FIGS. 4A, 4B, 4C and 4D are graphs plotting the simulated performance of the radio frequency amplifier circuit including the first embodiment of the active harmonic filter shown in FIG. 3.
Figure 4B:
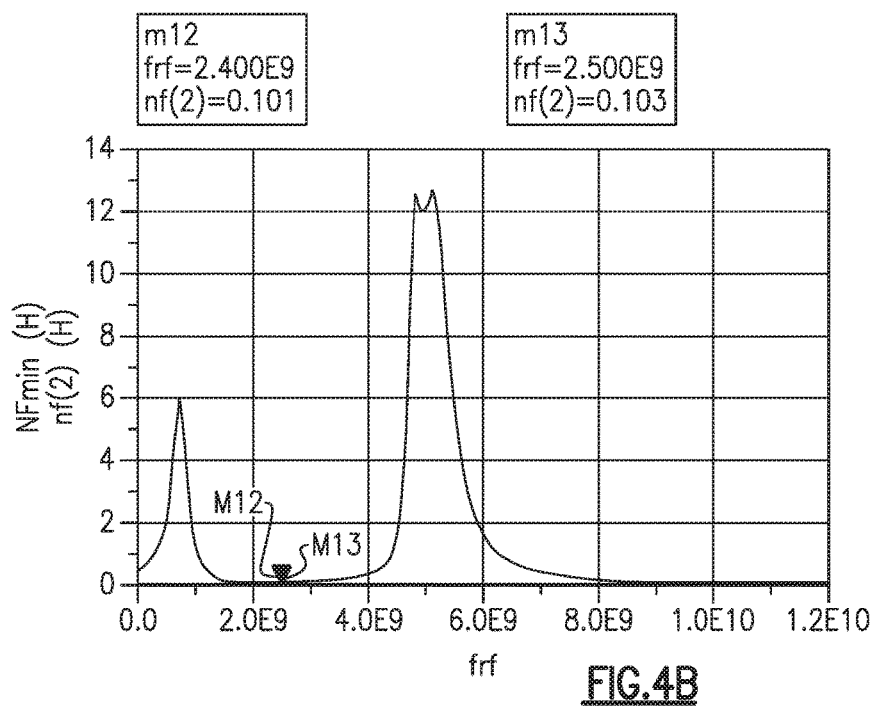
Figure 4C:
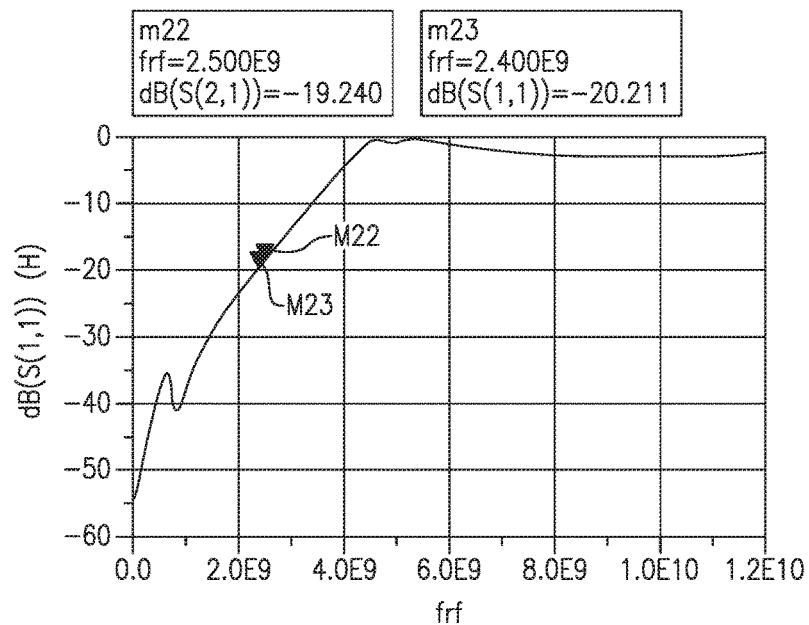

The graphs of FIGS. 4A-4B plot the simulated performance of the foregoing power amplifier circuit 66 incorporating the first embodiment of the active harmonic filter 50a that has been configured for operating in the 2.4 GHz to 2.45 GHz Industrial-Scientific-Medical (ISM) band. In particular, FIG. 4A shows the transmission insertion loss (S21) being minimal in the operating frequency range as indicated in plot points M14 and M15 at 2.4 GHz and 2.5 GHz, respectively. At the second harmonic of 5 GHz, however, there is approximately a −16 dB rejection, as indicated in plot points M24 and M29, corresponding to the 4.8 GHz harmonic and the 5.2 GHz harmonic, respectively. The graph of FIG. 4B shows the noise figure/degradation of the signal-to-noise ratio, which at plot points M12 and M13 corresponding to the operating/fundamental frequency of 2.4 GHz to 2.5 GHz, is minimal. The graph of FIG. 4C plots the input return loss (S11), which at the operating frequency range of 2.4 GHz to 2.5 GHz, is approximately −20 dB, indicating that the power amplifier circuit 66 is well matched. Along these lines, the Smith chart of FIG. 4D also plotting the input return loss (S11) further illustrates this.

Figure 5A:
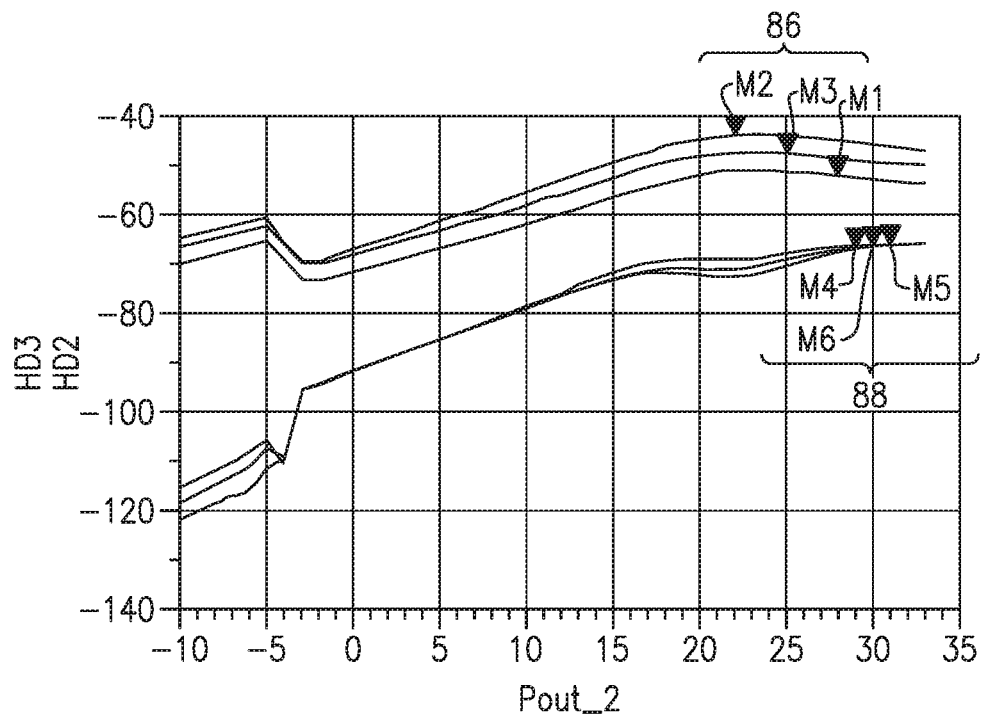
FIGS. 5A and 5B are graphs plotting the harmonics power components along simulated single tone power sweeps of the radio frequency amplifier circuit including the first embodiment of the active harmonic filter shown in FIG. 3.
Figure 5B:
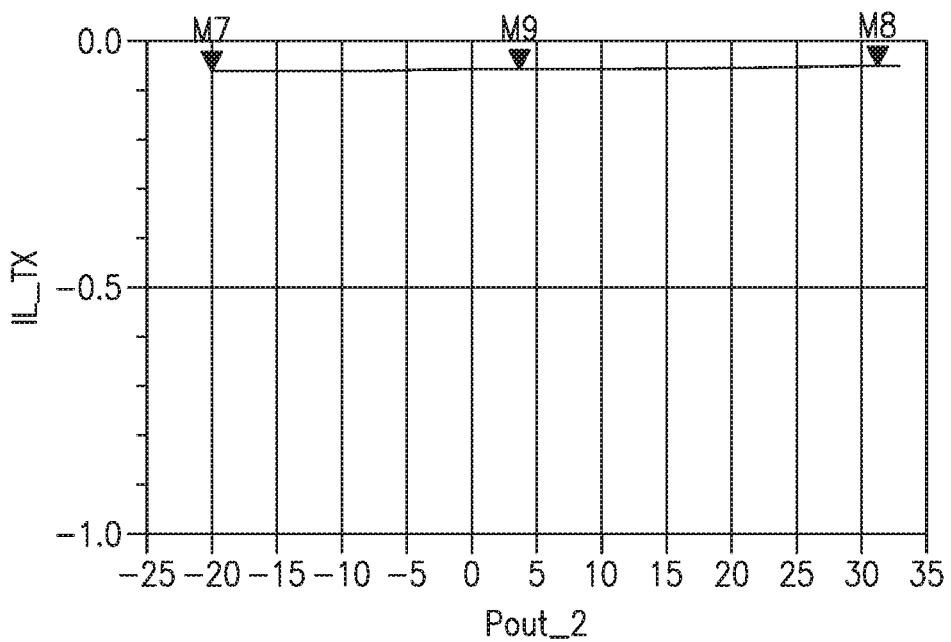

FIGS. 5A and 5B plot the simulated power sweep of the power amplifier circuit 66 incorporating the first embodiment of the active harmonic filter 50a with a single tone signal. The graph of FIG. 5A in particular includes a first set of plots 86 for the second harmonic, with plot points M1, M2, and M3 corresponding to the output power from the power amplifier circuit 66 with a 2.4 GHz signal, 2.45 GHz signal, and a 2.5 GHz signal, respectively. Additionally, there is a second set of plots 88 for the third harmonic, with plot points M4, M5, and M6 representative of the output power of the third harmonic over the sweep of the input power at the 2.45 GHz center fundamental frequency. As shown, the second harmonic distortion is less than −50 dBc and the third harmonic distortion is less than −73 dBc up to an in-band output power of 15 dBm. The graph of FIG. 5B plots the gain compression at different output power levels of the fundamental operating frequency of 2.4 GHz. Plot point M9 corresponds to an output power level of 3.945 dBm, plot point M8 corresponds to an output power level of 30.951 dBm, and plot point M7 corresponds to an output power level of −20.063 dBm. Across this range of output power levels, the gain compression remains less than 0.1 dB.

Figure 3:
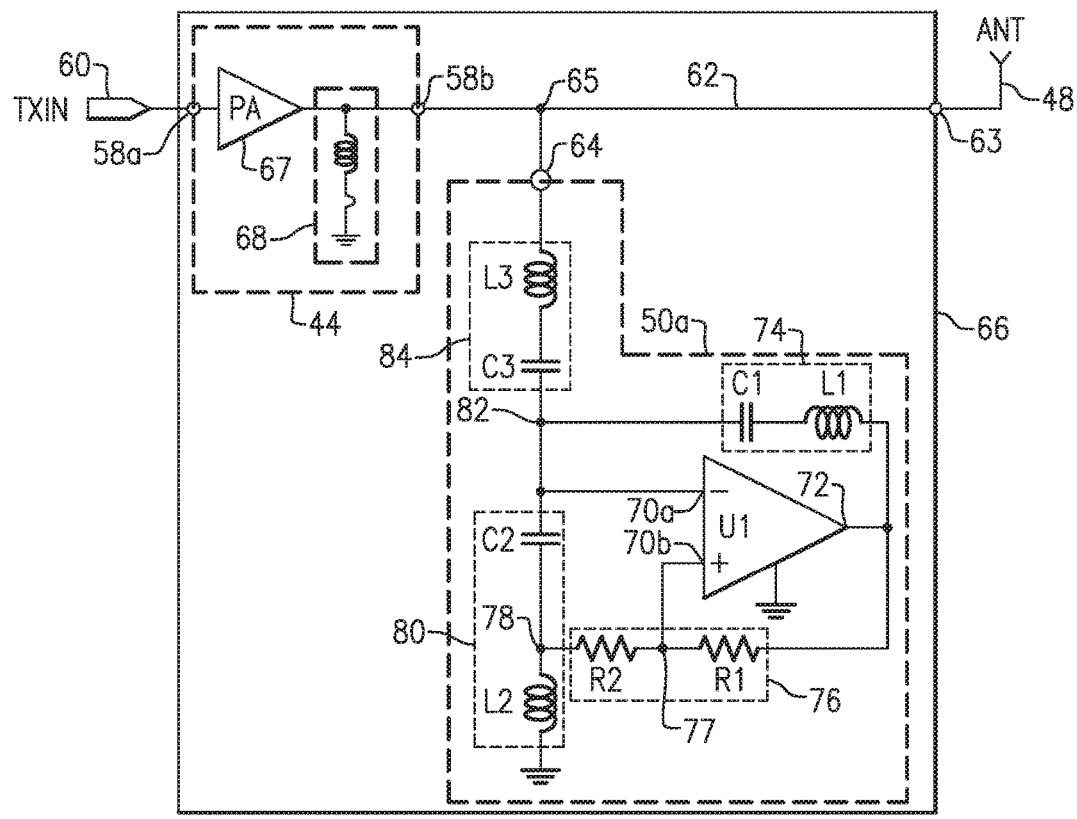
FIG. 3 is a schematic diagram of the radio frequency amplifier circuit including a first embodiment of the active harmonic filter.
Figure 6:
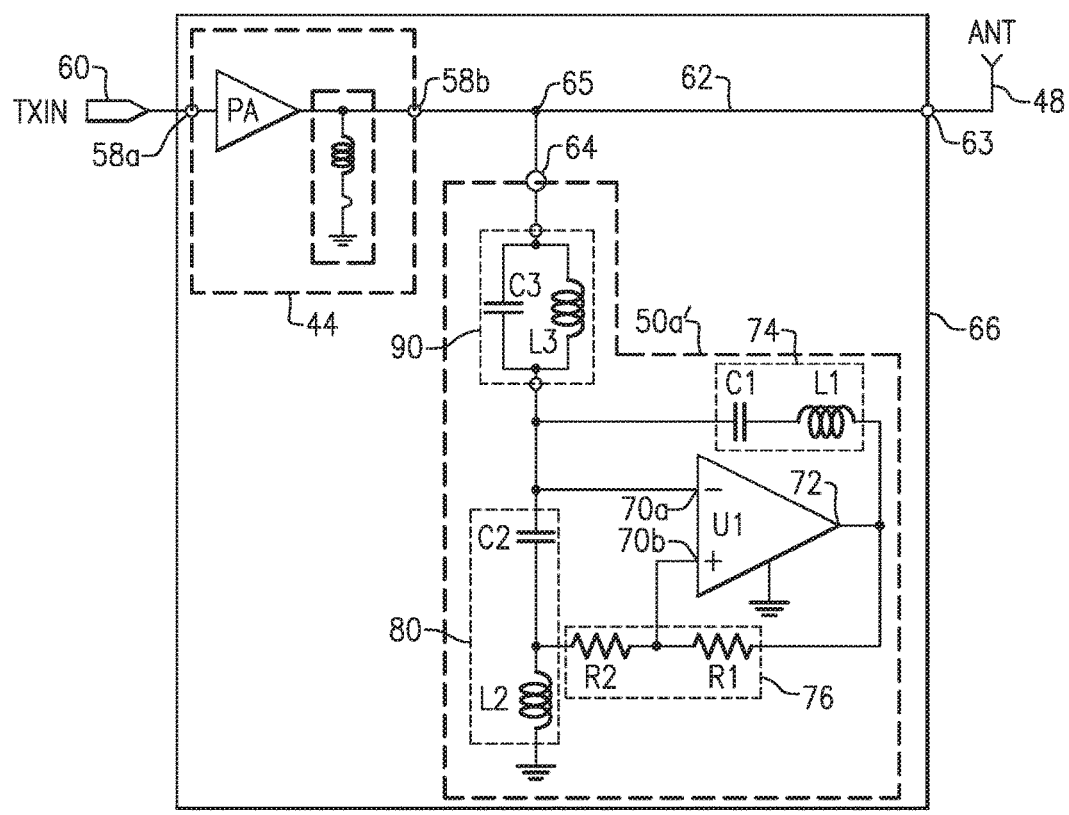
FIG. 6 is a schematic diagram of the radio frequency amplifier circuit including an alternative variant of the active harmonic filter.

The schematic diagram of FIG. 6 depicts another embodiment of the power amplifier circuit 66, which like the embodiment shown in FIG. 3, includes the power amplifier 44 that is connected to the transmit signal source 60 at the input 58a, and the output 58b connected to the transmission line 62 to the antenna 48. An alternative variant of the active harmonic filter 50a' is utilized, however. In further detail, the same operational amplifier U1 with the inverting input 70a, the non-inverting input 70b, and the single-ended output 72 is utilized. The first inductive-capacitive element 74 is connected to the inverting input 70a and the single-ended output 72. The resistor network 76 is likewise connected to the non-inverting input 70b, and to the second inductive-capacitive element 80.

The junction of the first inductive-capacitive element 74 and the second inductive-capacitive element 80 corresponds to the filter circuit interface node 82, which is tied to the first port 64 of the active harmonic filter 50. Interconnecting the first port 64 to the filter circuit interface node 82 is a first tank circuit 90, which is the capacitor C3 connected in parallel to the inductor L3. It is understood that the notch frequencies are tunable foe either the second or the third harmonic, or a combination of both the second harmonic and the third harmonic.

Figure 7:
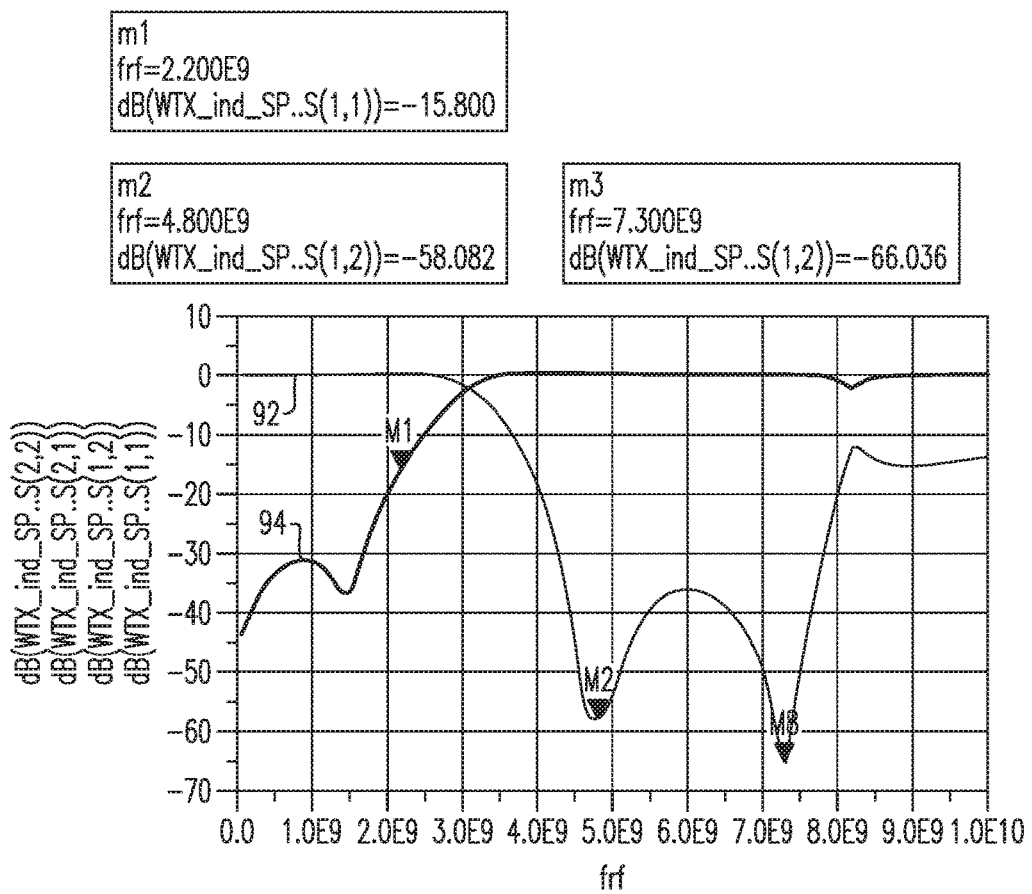
FIG. 7 is a graph plotting the scattering parameters (S-parameters) based upon a simulated performance of the radio frequency amplifier circuit including the second embodiment of the active harmonic filter shown in FIG. 6.

The graph of FIG. 7 plots the simulated performance of the foregoing power amplifier circuit 66 incorporating the second variant of the first embodiment of the active harmonic filter 50a' configured for operating in the 2.4 GHz to 2.45 GHz ISM band. A first plot 92 shows the reverse isolation (S12), with a plot point M2 corresponding to an isolation of approximately −58 dB at the second harmonic frequency of 4.8 GHz, and a plot point M8 corresponding to an isolation of approximately −66 dB at the third harmonic frequency of 7.3 GHz. A second plot 94 is of the input return loss (S11), which at the operating frequency range is approximately −15 dB.

Figure 8:
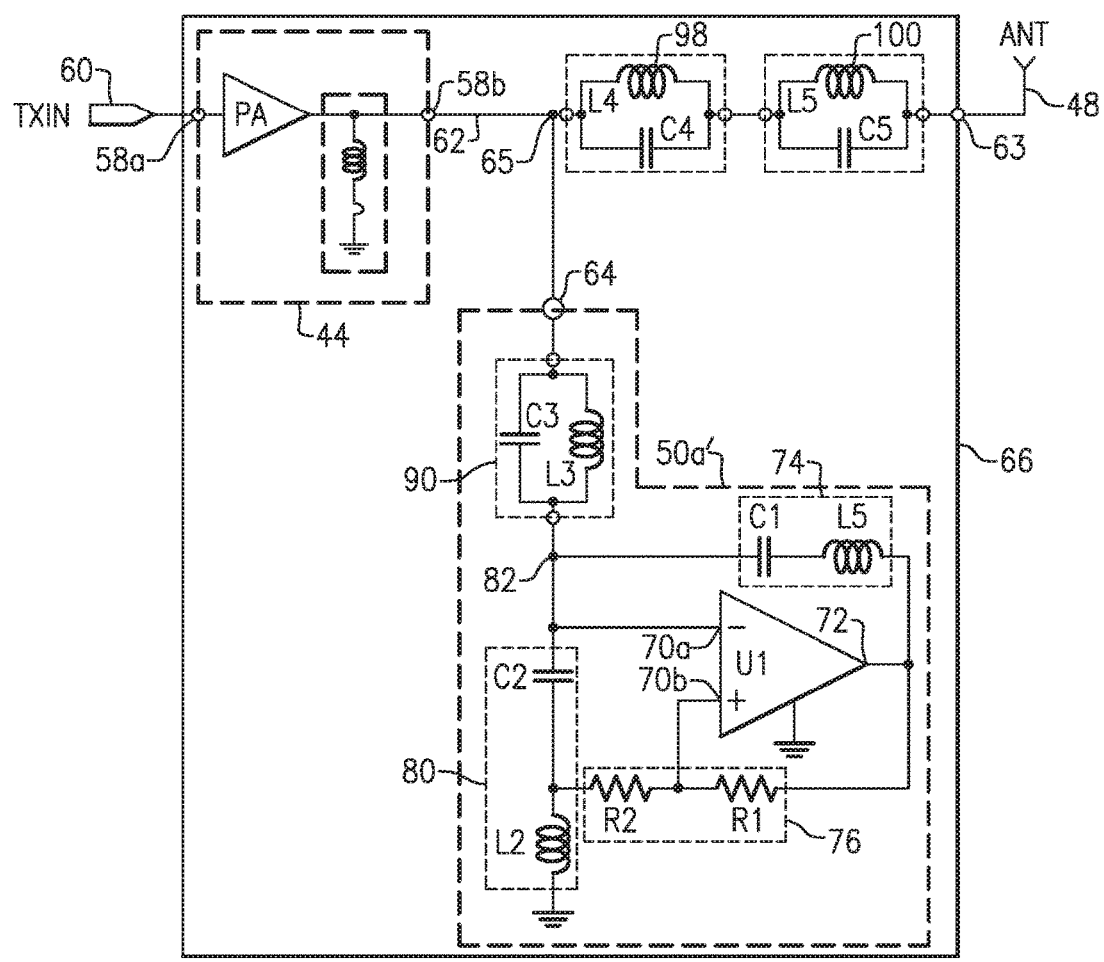
FIG. 8 is a schematic diagram of the radio frequency amplifier circuit including two additional tank circuits connected to the transmission line.

The schematic diagram of FIG. 8 depicts an embodiment of the power amplifier circuit 66 that again includes the power amplifier that is connected to the transmit signal source 60 at the input 58a, and the output 58b that is connected to the transmission line 62 to the antenna 48. The aforementioned second variant of the first embodiment of the active harmonic filter 50a', is utilized. As discussed above, there is the operational amplifier U1 with the inverting input 70a, the non-inverting input 70b, and the single-ended output 72. The first inductive-capacitive element 74 is connected to the inverting input 70a and the single-ended output 72, and the resistor network 76 is connected to the non-inverting input 70b, and to the second inductive-capacitive element 80.

The junction of the first inductive-capacitive element 74 and the second inductive-capacitive element 80 corresponds to the filter circuit interface node 82, which is tied to the first port 64 of the active harmonic filter 50. Interconnecting the first port 64 to the filter circuit interface node 82 is the first tank circuit 90.

Additionally connected in line with the transmission line 62 from the first port 64 of the active harmonic filter 50 is a second tank circuit 98, which includes an inductor L4 connected in parallel with the capacitor C4. This embodiment also incorporates a third tank circuit 100 with an inductor L5 connected in parallel with the capacitor C5. As will be discussed further, the power amplifier circuit 66 is understood to exhibit a higher level of rejection of the second and third harmonics over the other embodiments. For purposes of simulating the performance of the power amplifier circuit 66, in the first tank circuit 90, the capacitor C3 is assigned an exemplary value of 3.4 pF, while the inductor is assigned an exemplary value of 0.2 nH. Furthermore, in the second tank circuit 98, the capacitor C4 is assigned an exemplary value of 2.4 pF and the inductor L4 is assigned an exemplary value of 0.2 nH. Finally, in the third tank circuit 100, the capacitor C5 is assigned an exemplary value of 4.9 pF and the inductor L5 is assigned an exemplary value of 0.2 nH. It will be recognized by those having ordinary skill in the art that these values are presented by way of example only, and not of limitation.

Figure 9A:
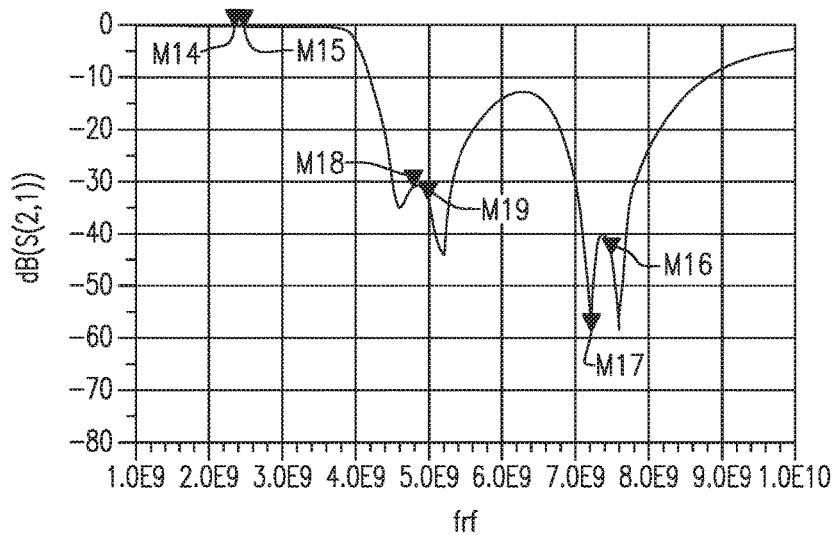
FIGS. 9A, 9B, 9C, and 9D are graphs plotting the simulated performance of the radio frequency amplifier circuit shown in FIG. 8.
Figure 9B:
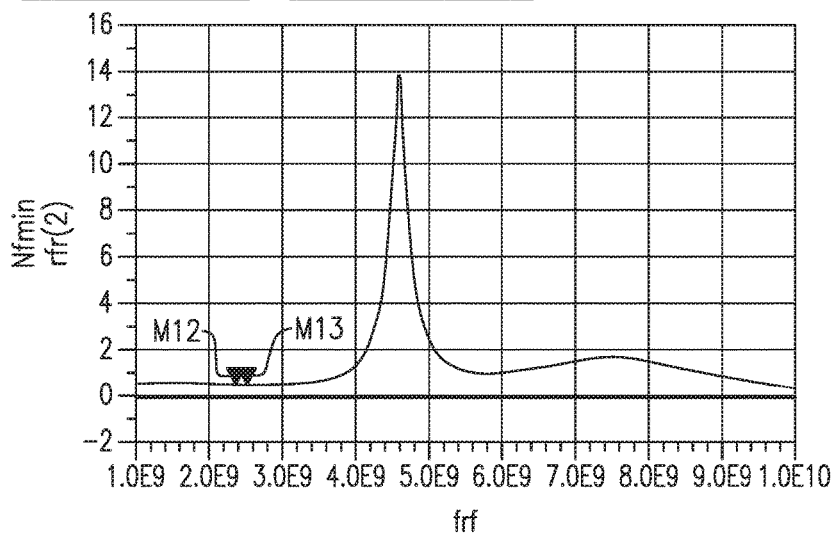
Figure 9C:
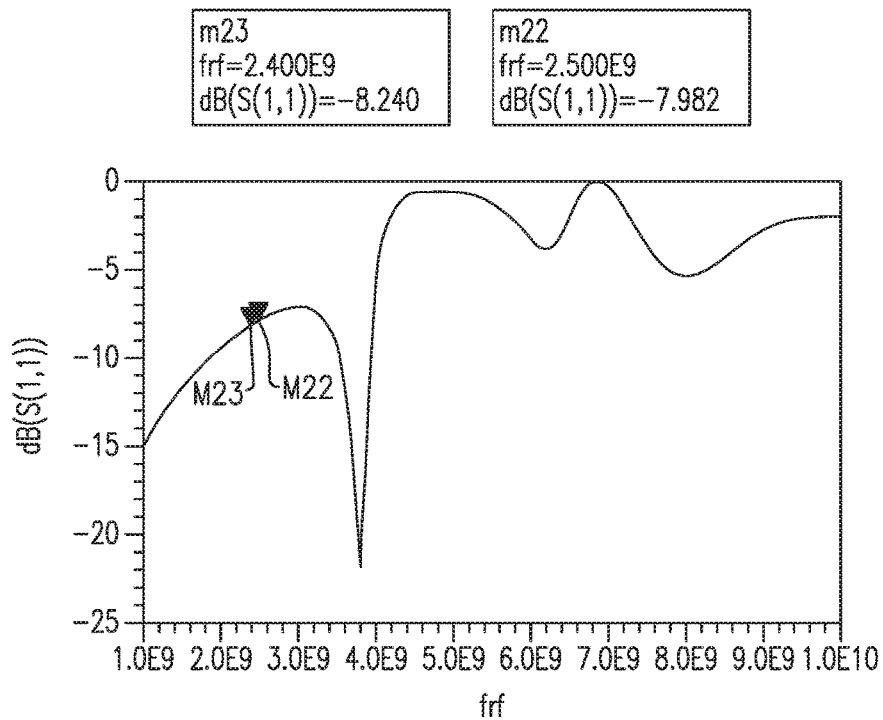
Figure 9D:
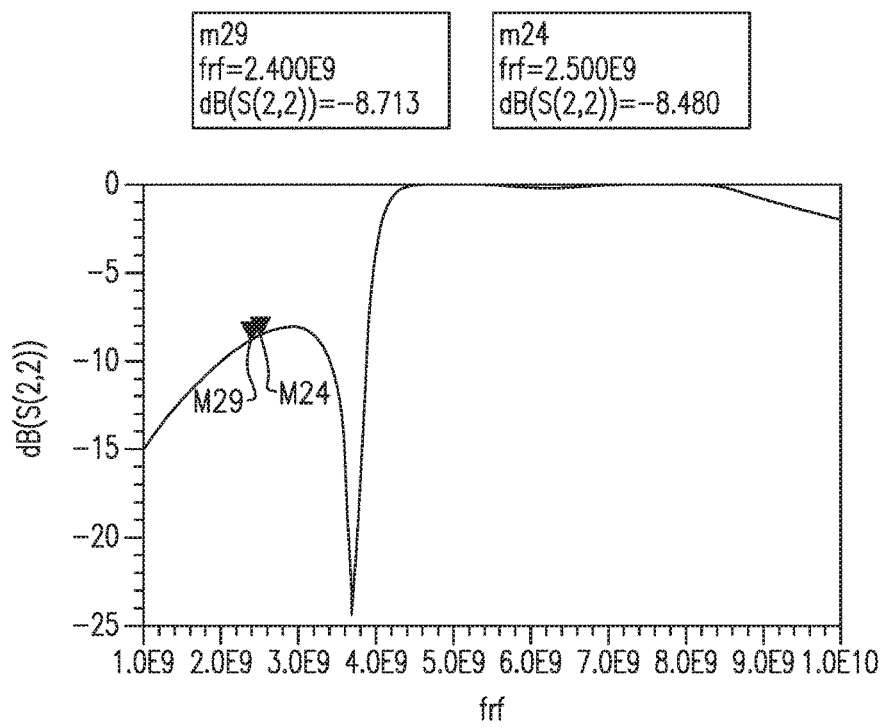

The graphs of FIGS. 9A and 9B plot the simulated performance of the power amplifier circuit 66 shown in FIG. 8, which is configured for operation in the 2.4 GHz to 2.45 GHz ISM band. FIG. 9A in particular shows the transmission insertion loss (S21) being minimal in the operating frequency range as indicated in plot points M14 and M15 at 2.4 GHz and 2.5 GHz, respectively. At the second harmonic of 5 GHz, however, there is approximately a –30 dB rejection, as indicated in plot points M18 and M19, corresponding to the 4.8 GHz harmonic and the 5 GHz harmonic, respectively. At the third harmonic band of 7.2 GHz, there is another harmonic rejection notch of at least –40 dB, with a plot point M16 corresponding to the 7.5 GHz harmonic frequency being rejected by –43.840 dB, and a plot point M17 corresponding to the 7.2 GHz harmonic frequency.

Figure 4D:
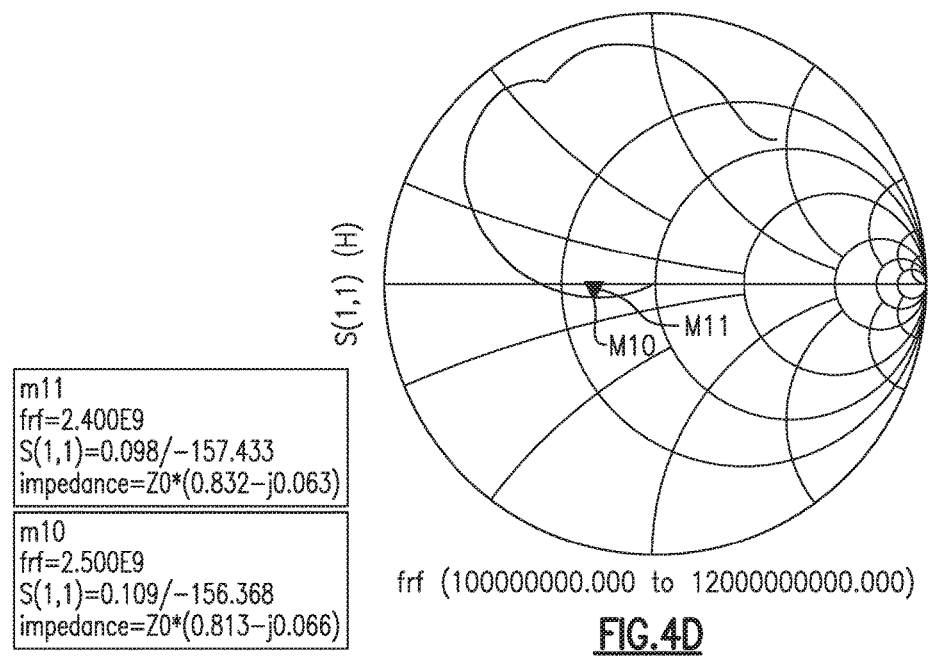

The graph of FIG. 9B shows the noise figure/degradation of the signal-to-noise ratio, which at plot points M12 and M13 corresponding to the operating/fundamental frequency of 2.4 GHz to 2.5 GHz, is minimal. The graph of FIG. 4C plots the input return loss (S11), which at the operating frequency range of 2.4 GHz to 2.5 GHz, is approximately –8 dB, with the plot point M23 for the 2.4 GHz frequency indicating –8.240 dB and the plot point M22 for the 2.5 GHz frequency indicating –7.982 dB. FIG. 4D plots the output return loss (S22), with a plot point M29 for the 2.4 GHz operating frequency being –8.813 dB and a plot point M24 for the 2.5 GHz operating frequency being –8.480 dB.

Figure 10:
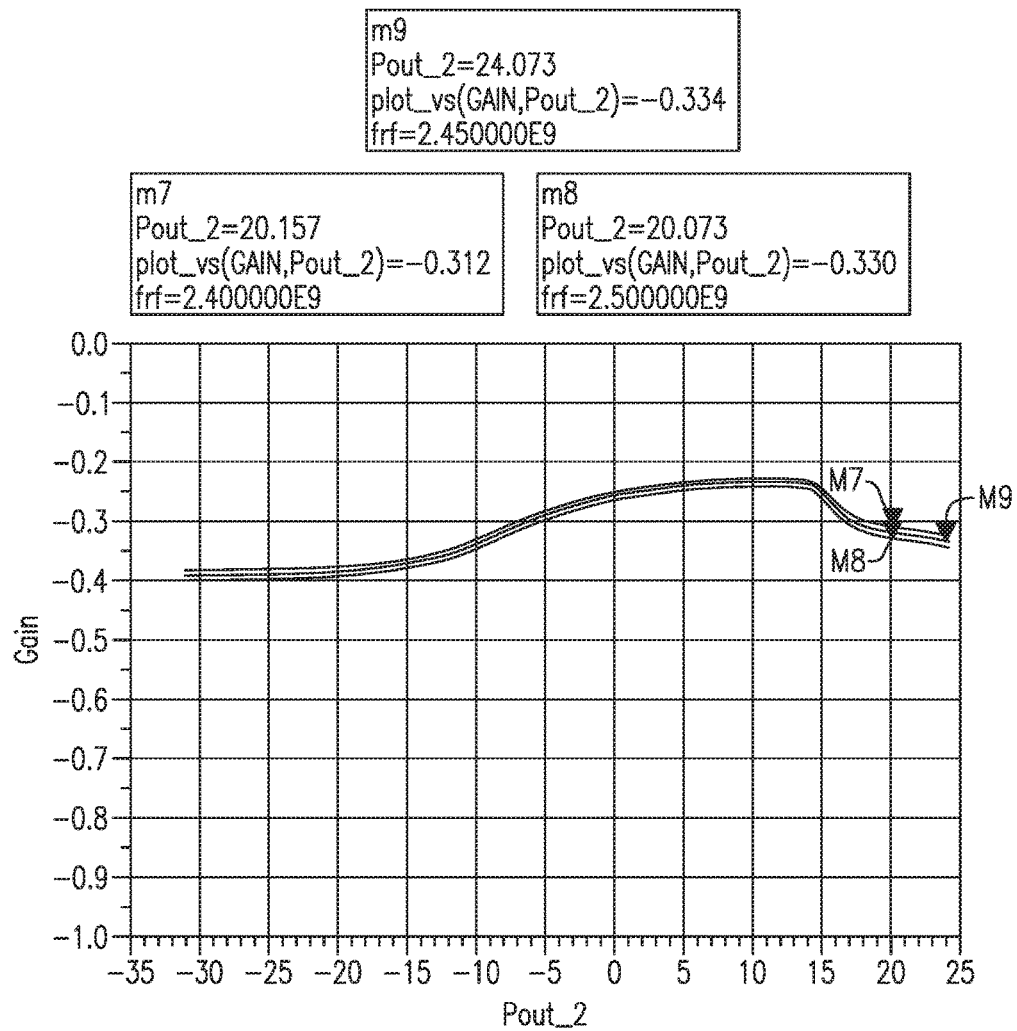
FIG. 10 is a graph plotting insertion loss along a power sweep in the radio frequency amplifier circuit shown in FIG. 8.

The graph of FIG. 10 plots the insertion loss of the power amplifier circuit 66 over a power sweep with a fundamental frequency (2.4 GHz) signal. There are separate plots for 2.4 GHz, 2.45 GHz, and 2.5 GHz signals. As shown in the graph, there is a slight loss expansion at mid to high power levels.

Figure 11A:
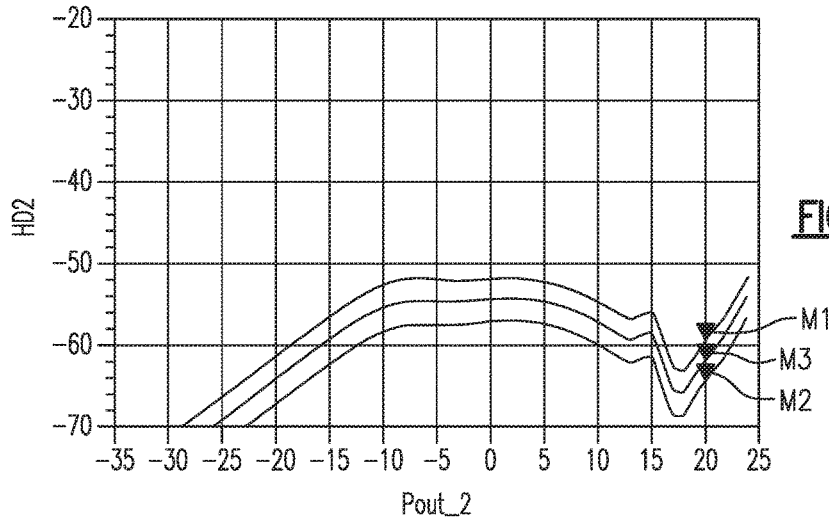
FIGS. 11A and 11B are graphs plotting the second and third harmonics power components along a simulated single tone power sweeps of the radio frequency amplifier circuit shown in FIG. 8.
Figure 11B:
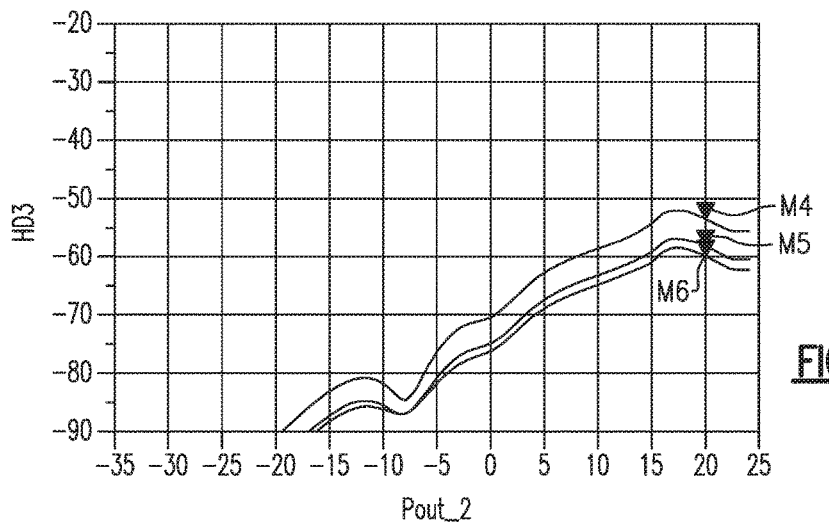

FIGS. 11A and 11B plot the simulated power sweep of the power amplifier circuit 66 incorporating the second variant of the first embodiment of the active harmonic filter 50a', the second tank circuit 98, and the third tank circuit 100, with a single tone signal. The graph of FIG. 11A in particular includes a set of plots for the second harmonic, with plot points M1, M2, and M3 corresponding to the output power from the power amplifier circuit 66 with a 2.4 GHz signal, a 2.5 GHz signal, and a 2.45 GHz signal, respectively. The graph of FIG. 11B plots the third harmonic, with plot points M4, M5, and M6 corresponding to the output power with a 2.5 GHz signal, a 2.45 GHz signal, and a 2.4 GHz signal. As shown, the second harmonic and third harmonic distortions are less than –53 up to an in-band output power of 25 dBm.

Figure 12A:
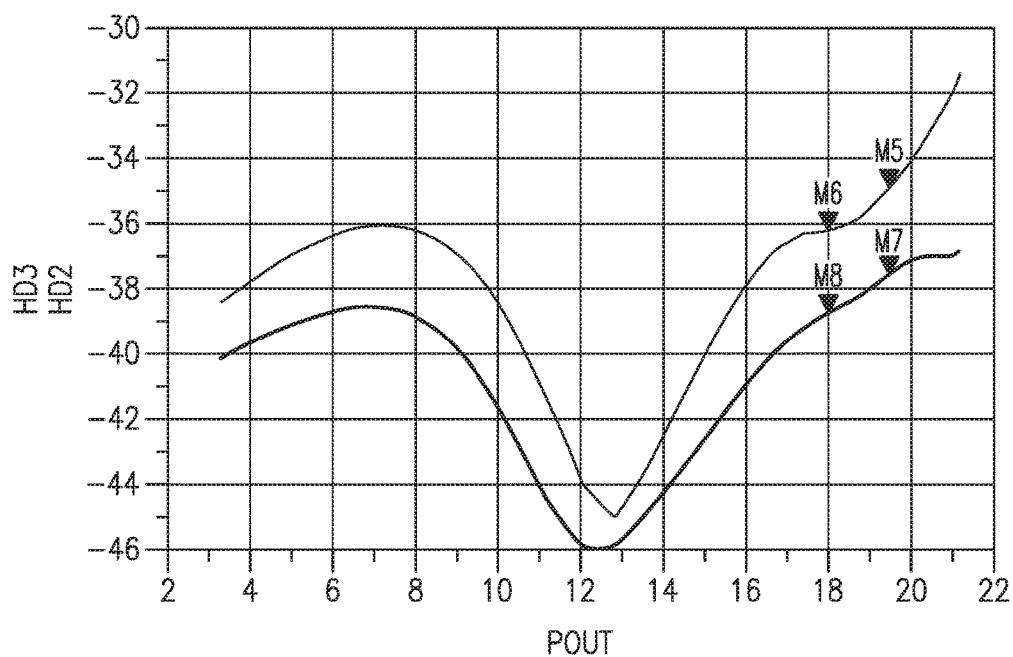
FIGS. 12A and 12B are graphs plotting the harmonic components from the radio frequency amplifier circuit shown in FIG. 8, with FIG. 12A showing the simulated harmonics output without the active harmonic filter, and FIG. 12B showing the simulated harmonics output with the active harmonic filter.
Figure 12B:
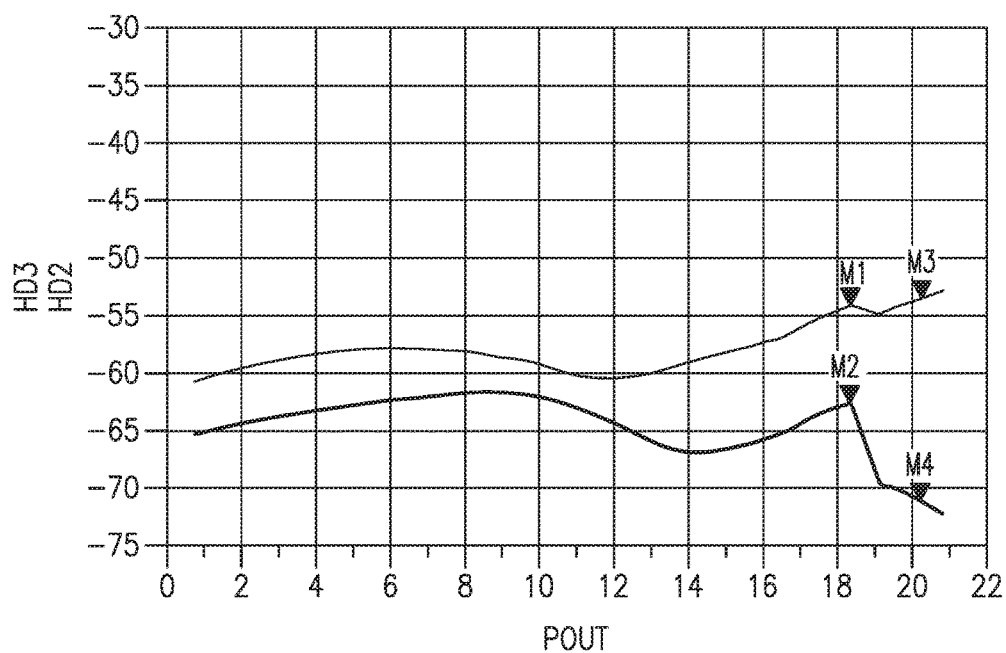

The significant reduction in the second and third harmonics by the incorporation of the active harmonic filter 50 may be seen from a comparison of the plots of FIGS. 12A and 12B. Specifically, FIG. 12A plots the second harmonic and third harmonic power across a power sweep for a signal with its fundamental frequency of 2.45 GHz in the power amplifier circuit 66 without the active harmonic filter 50. FIG. 12B plots the second harmonic and third harmonic power across a power sweep with the circuit including the active harmonic filter 50.

Figure 13:
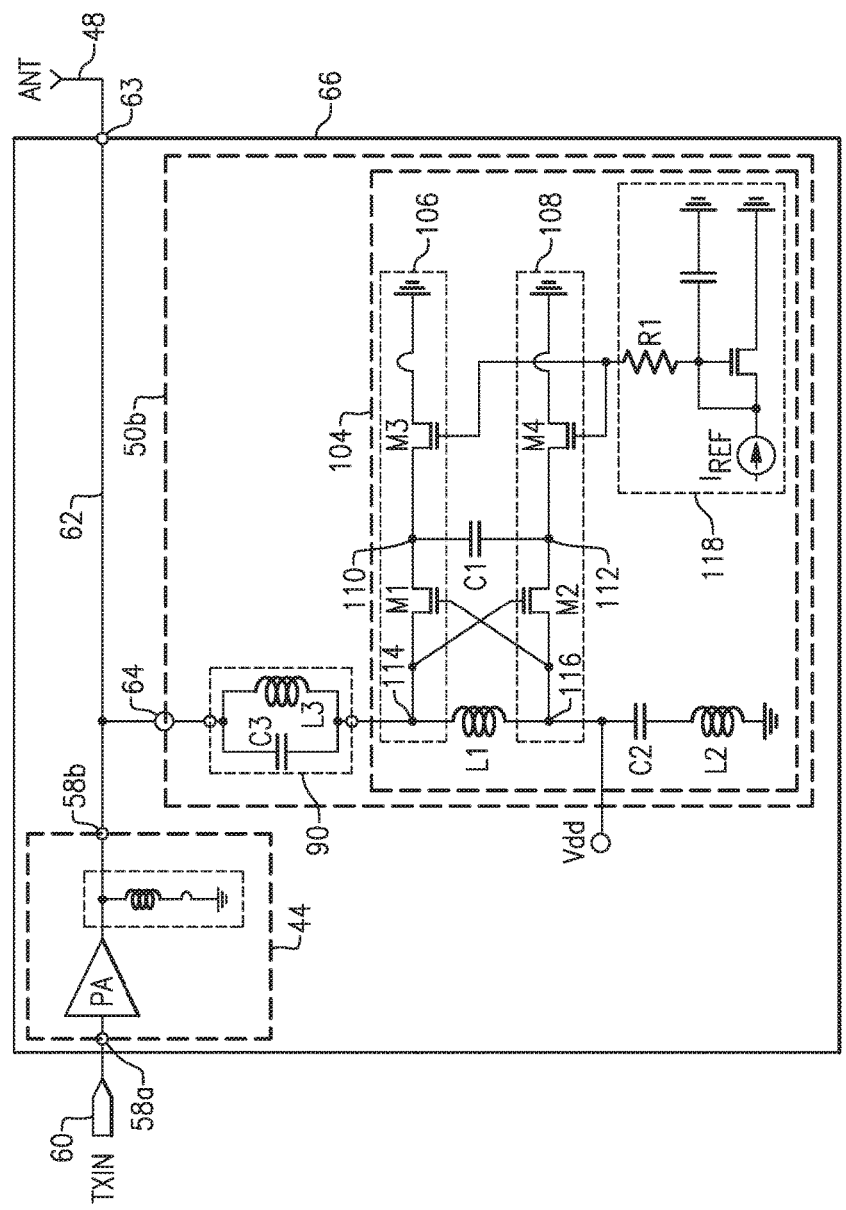
FIG. 13 is a schematic diagram of the radio frequency amplifier circuit including a second embodiment of the active harmonic filter implemented with a differential amplifier circuit.

Referring now to the schematic diagram of FIG. 13, the power amplifier circuit 66 illustrated therein utilizes a second embodiment of the active harmonic filter 50b with a differential amplifier that provide active capacitances. With the passive components connected thereto, active resonant circuits are defined. The active resonant circuits are understood yield a significantly higher Q-factor, especially when compared to passive resonant circuits.

Referring to the schematic diagram of FIG. 13, the power amplifier circuit 66 includes the power amplifier 44 that is connected to the transmit signal source 60 at the input 58a, and the output 58b that is connected to the transmission line 62 to the antenna 48. A second embodiment of the active harmonic filter 50b is connected to the transmission line 62 at a junction 102. The active harmonic filter 50b is likewise a single port device with the first port 64, which is connected to the junction 102.

In further detail, the active harmonic filter 50b is a differential amplifier circuit 104 that includes a first pair of transistors M1 and M2, and a second pair of transistors M3 and M4. As illustrated, the transistor M1 is connected to the transistor M3, and the transistor M2 is connected to the transistor M4. Thus, each transistor in the first pair are connected to a respective one of the transistors in the second pair. The interconnected transistors M1 and M3 define an inverting differential circuit segment 106, while the interconnected transistors M2 and M4 define a non-inverting differential circuit segment 108.

Although the transistor M1, M2, M3, and M4 are depicted as field effect transistors, this is by way of example only and not of limitation. Any suitable type of transistor may be substituted without departing from the scope of the present disclosure. Furthermore, the transistors and the related circuitry may be fabricated using silicon-based technologies such as bulk CMOS (complementary metal oxide semiconductor), SOI (silicon-on-insulator), and BiCMOS (integration of bipolar junction and complementary metal oxide semiconductor fabrication technologies). Other semiconductor technologies such as GaAs (gallium arsenide) may also be utilized.

The inverting differential circuit segment 106 is connected to the non-inverting differential circuit segment 108 with one or more passive components, including a capacitor C1 and an inductor L1. Specifically, a junction 110 of the transistor M1 and M3, which is understood to be a part of the inverting differential circuit segment 106, is connected over the capacitor C1 to a junction 112 of the transistor M2 and M4, which is understood to be part of the non-inverting differential circuit segment 108. A junction 114 connected to the transistor M1, and a junction 116 connected to the transistor M2, are interconnected to each other with the inductor L1, which may have an exemplary value of 330 pH. Also connected to the junction 116 is a capacitor C2 that is connected in series with the inductor L2, which may be implemented as a bond wire, to ground. A voltage supply VDD is also connected to the junction 116. In this regard, the capacitor C2 is understood to DC-decouple to the voltage supply VDD from ground. By way of example, the capacitor C2 may have a value of 3 pF.

The gate of the transistor M1 is connected to the junction 116, while the gate of the transistor M2 is connected to the junction 114. The bias point of the transistors M3 and M4 are set by a bias setting circuit 118 that includes a current source Iref and a resistor R1. The bias setting circuit 118 is connected to the gate of both the transistor M3 and M4.

The junction 114 is connected to the first tank circuit 90 with the capacitor C3 and the L3, which in turn is connected to or otherwise electrically contiguous with the first port 64. The first tank circuit 90, together with the negative capacitance of the differential amplifier circuit 104 is understood to define a first harmonic trap for rejecting the harmonics of the signal on the output 58b of the power amplifier 44. According to one embodiment, the inductor L3 has a value of 1 nH, and the capacitor C3 has a value of 4 pF. The absolute value of the negative capacitance, along with its dependent relationship to the operating frequency, is defined by the size of the transistors M1, M2, M3, and M4, along with the inductance value of the inductor L1, and the capacitance value of the capacitor C1. The negative capacitance converts the reactive part of the impedance, so little noise is introduced to the transmission line 62. As will be illustrated below, the active harmonic filter 50b defines one or more frequency "notches" that correspond to harmonic frequencies that are rejected thereby. The inductors L1 and L3, together with the capacitor C1, is understood to define one of the notch frequencies. The inductors L3 and the capacitor C3 sets the pass-band characteristics of the active harmonic filter 50b. The impedance at the operating/fundamental frequency may be greater than 1 kΩ to minimize in-band signal losses.

Figure 14A:
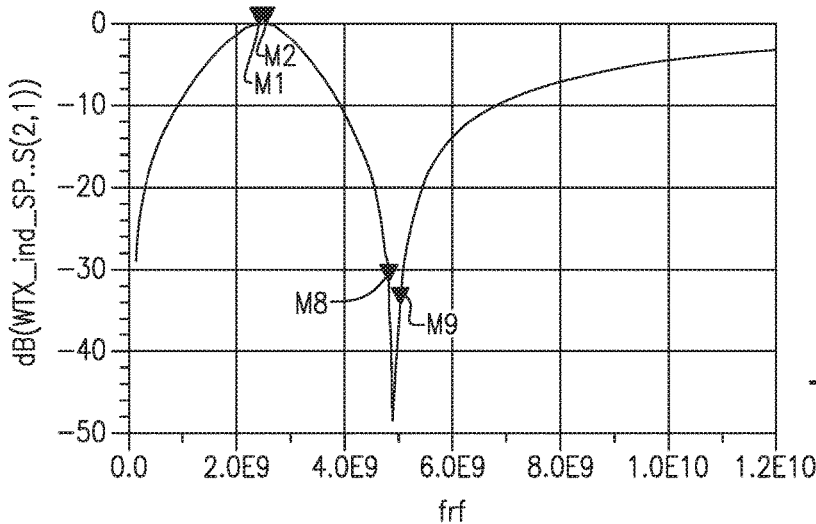
FIGS. 14A, 14B, 14C and 14D are graphs plotting the simulated performance of the radio frequency amplifier circuit including the second embodiment of the active harmonic filter shown in FIG. 13.
Figure 14B:
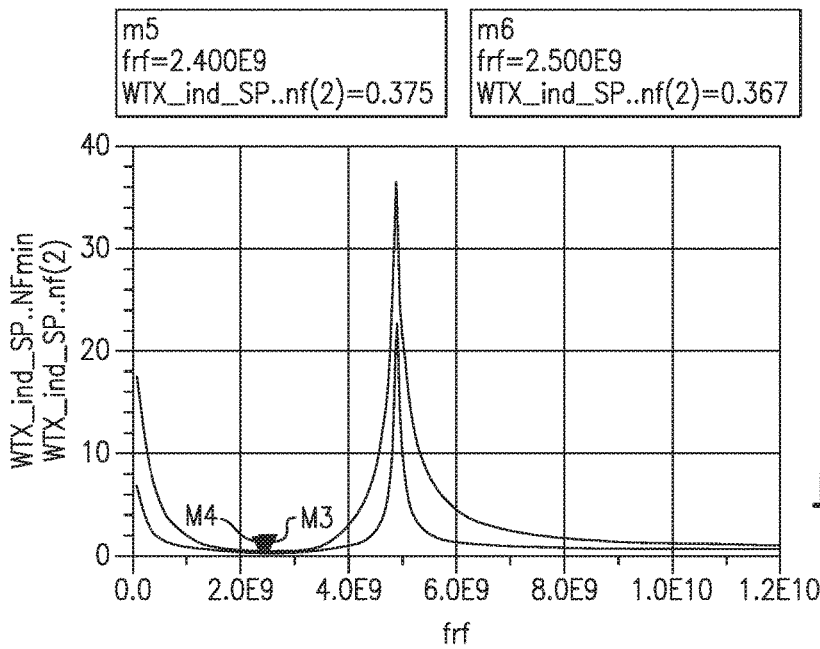

The graphs of FIGS. 14A-14B plot the simulated performance of the foregoing power amplifier circuit 66 incorporating the second embodiment of the active harmonic filter 50b that has been configured for operating in the 2.4 GHz to 2.45 GHz ISM band. FIG. 14A shows the transmission insertion loss (S21) being minimal in the operating frequency range as indicated in plot points M1 and M1 at 2.4 GHz and 2.5 GHz, respectively. At the second harmonic of 5 GHz, however, there is a rejection "notch" of at least −31 dB. Specifically, the plot point M8 corresponding to the 4.8 GHz harmonic frequency shows a rejection of −31.854 dB, while the plot point M9 corresponding to the 5 GHz harmonic frequency shows a rejection of −34.417 dB.

The graph of FIG. 14B shows the noise figure/degradation of the signal-to-noise ratio, which at plot points M5 and M6 corresponding to the operating/fundamental frequency of 2.4 GHz to 2.5 GHz, is minimal (less than 0.4 dB).

Figure 14C:
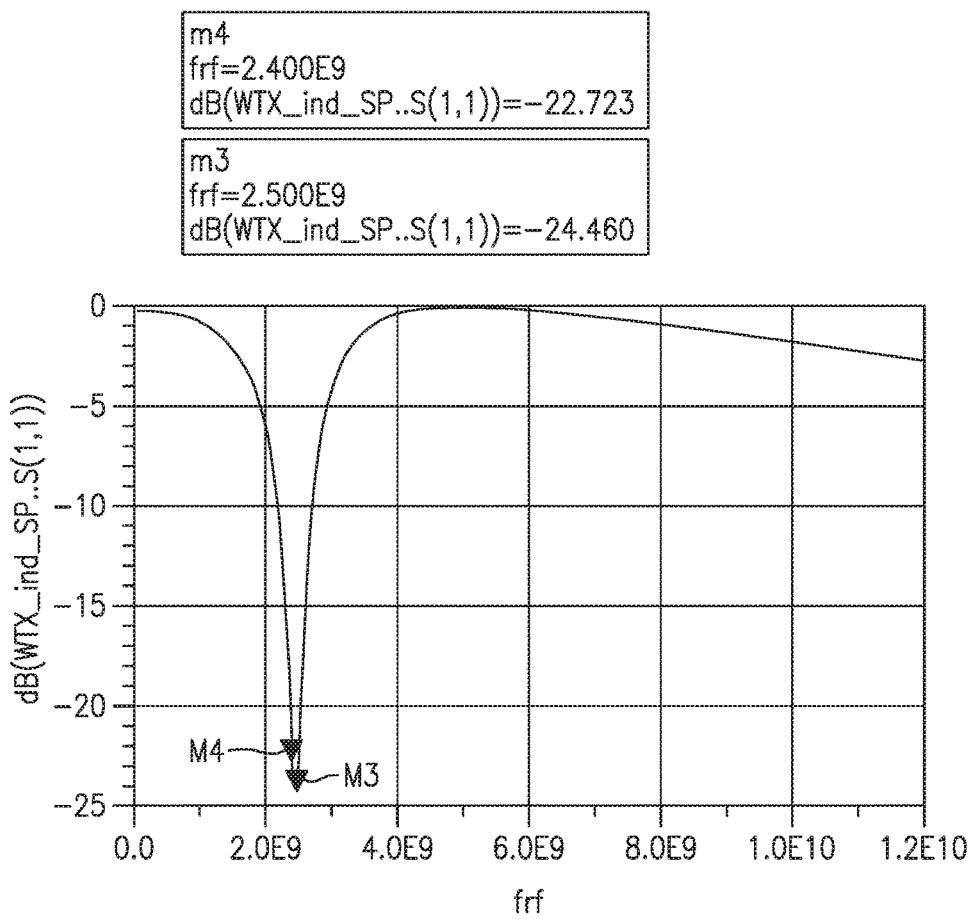
Figure 14D:
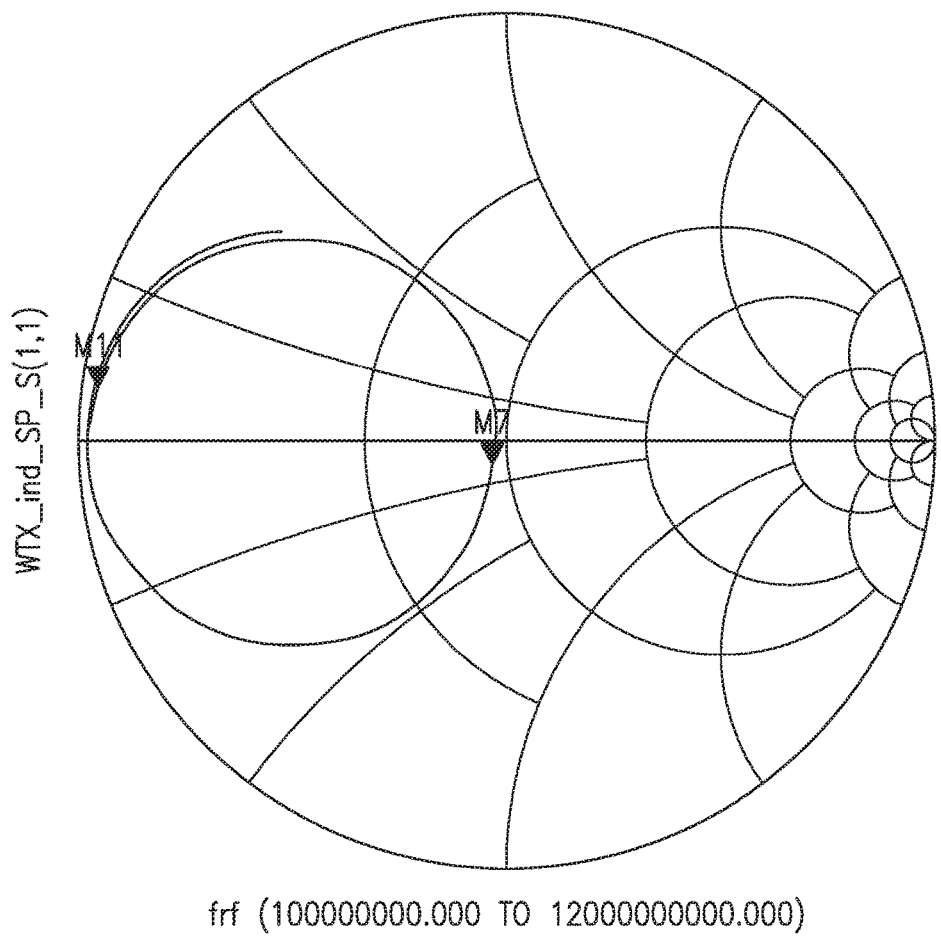

The graph of FIG. 14C plots the input return loss (S11), which at the operating frequency range of 2.4 GHz to 2.5 GHz, is less than −20 dB, indicating that the power amplifier circuit 66 is well matched. Along these lines, the Smith chart of FIG. 14D also plotting the input return loss (S11) further illustrates this.

Figure 15A:
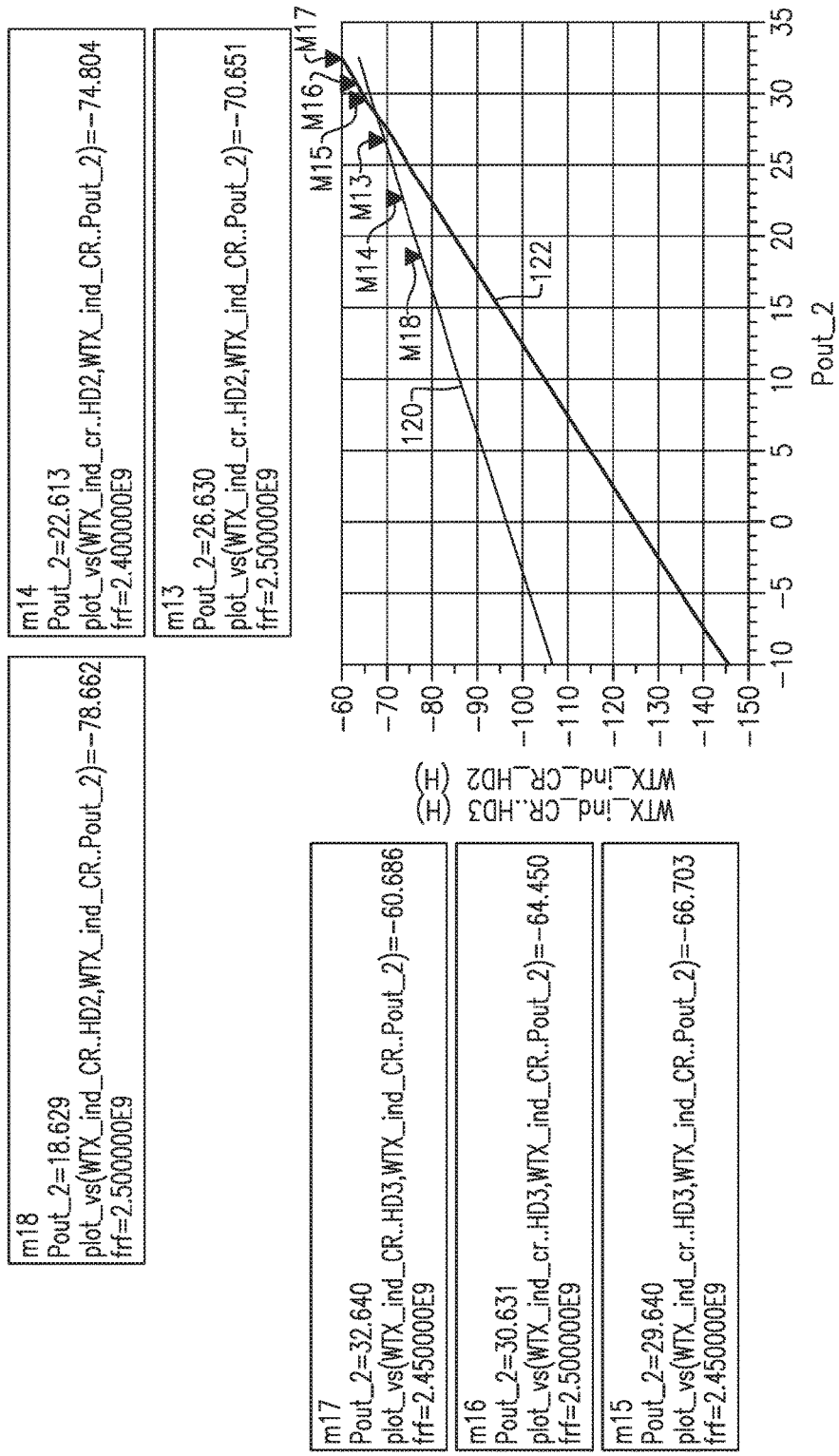
FIGS. 15A and 15B are graphs plotting the harmonics power components along simulated single tone power sweeps of the radio frequency amplifier circuit including the second embodiment of the active harmonic filter shown in FIG. 13.
Figure 15B:
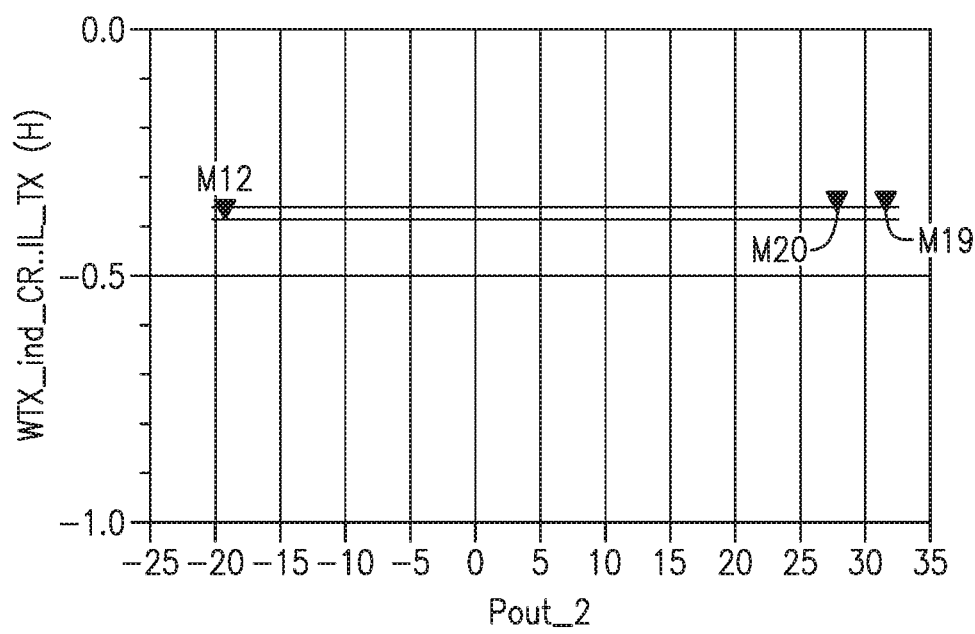

FIGS. 15A and 15B plot the simulated power sweep with a single tone signal of the power amplifier circuit 66 incorporating the second embodiment of the active harmonic filter 50b. The graph of FIG. 15A in particular includes a first set of plots 120 for the second harmonic, with plot points M14, M18, and M13 corresponding to the output power from the power amplifier circuit 66 with a 2.4 GHz signal, 2.45 GHz signal, and a 2.5 GHz signal, respectively. Additionally, there is a second set of plots 122 for the third harmonic, with plot points M15, M17, and M16 representative of the output power of the third harmonic over the sweep of the input power at the 2.5 GHz center fundamental frequency. As shown, the harmonic distortion is less than −63 dBc up to an in-band output power of 32 dBm. The graph of FIG. 15B plots the gain compression at different output power levels of the fundamental operating frequency of 2.4 GHz. Plot point M12 corresponds to an output power level of −19.386 dBm, plot point M20 corresponds to an output power level of 27.630 dBm, and plot point M19 corresponds to an output power level of 31.64 dBm. Across this range of output power levels, the gain compression remains less than 0.1 dB up to an in-band output power of 32 dBm.

Figure 16:
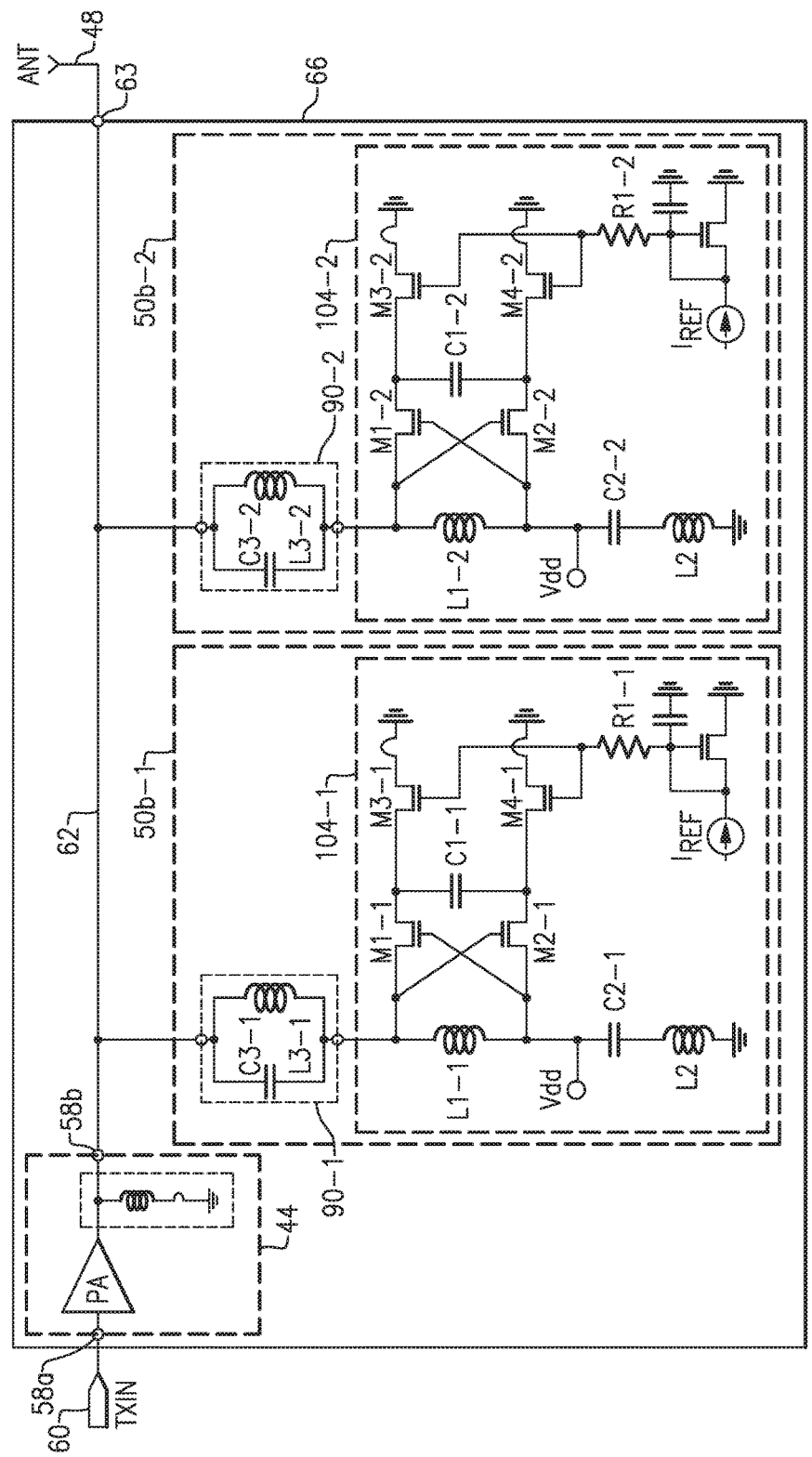
FIG. 16 is a schematic diagram of the radio frequency amplifier circuit including two of the second embodiment of the active harmonic filter implemented with the differential amplifier circuit.

Referring to the schematic diagram of FIG. 16, the power amplifier circuit 66 again includes the power amplifier 44 that is connected to the transmit signal source 60 at the input 58a, and the output 58b that is connected to the transmission line 62 to the antenna 48. In accordance with the illustrated embodiment, two separate active harmonic filters 50 are connected to the transmission line, but each instance thereof is understood to be the second embodiment 50b described above, e.g., the differential amplifier implementation. In this regard, the first instance of the active harmonic filter 50b-1 includes a first instance of the first tank circuit 90-1, as well as a first instance of the differential amplifier circuit 104-1. Likewise, the second instance of the active harmonic filter 50b-2 includes a second instance of the first tank circuit 90-2, and a second instance of the differential amplifier circuit 104-2. The first instance of the differential amplifier circuit 104-1 and the second instance of the differential amplifier circuit 104-2 are understood to be configured and operate the same way as discussed above in relation to the differential amplifier circuit 104. As such, a discussion on the configuration of such subparts of the differential amplifier circuits 104-1 and 104-2 will be omitted for the sake of brevity.

Figure 17A:
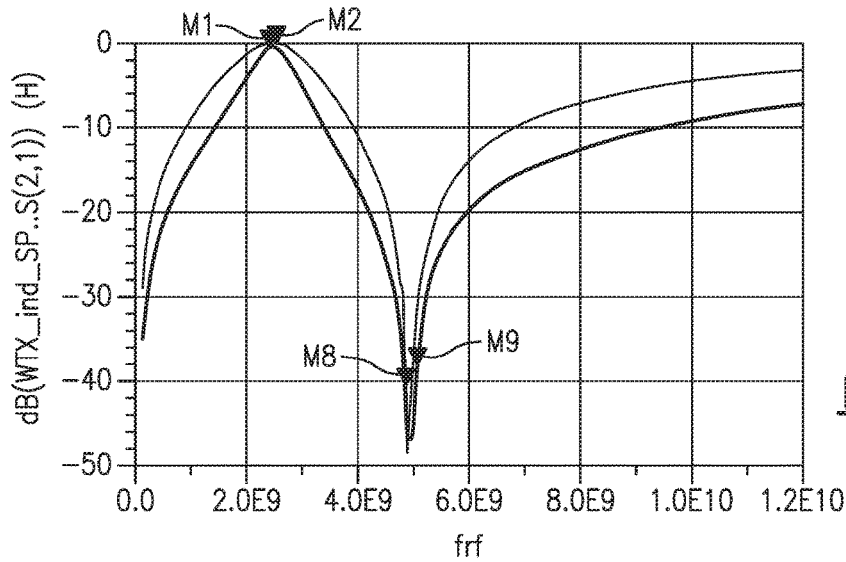
FIGS. 17A, 17B, 17C and 17D are graphs plotting the simulated performance of the radio frequency amplifier circuit shown in FIG. 16.
Figure 17B:
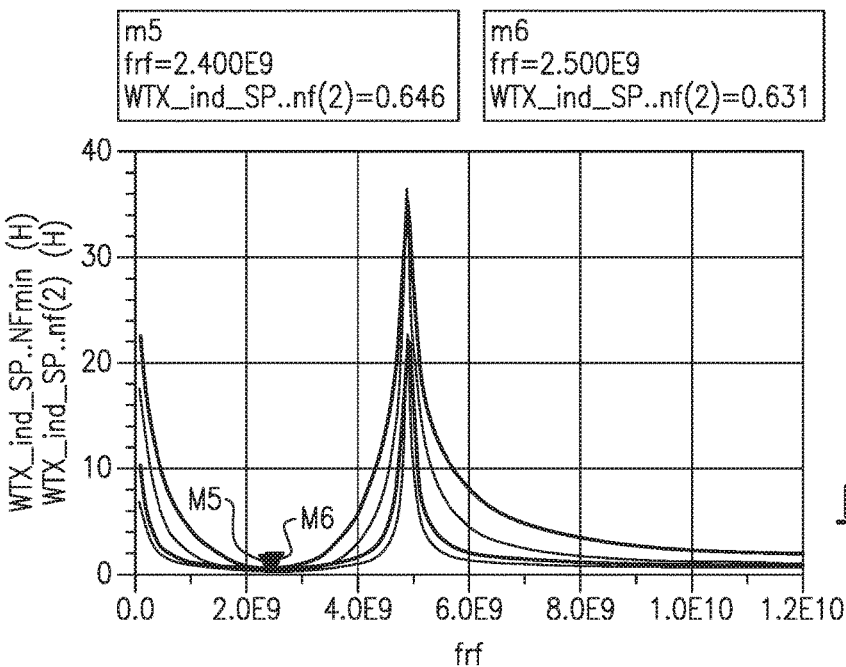

The graphs of FIGS. 17A-17B plot the simulated performance of the foregoing power amplifier circuit 66 as shown in FIG. 16 that has been configured for operating in the 2.4 GHz to 2.45 GHz ISM band. FIG. 17A shows the transmission insertion loss (S21) being minimal in the operating frequency range as indicated in plot points M1 and M1 at 2.4 GHz and 2.5 GHz, respectively. At the second harmonic of 5 GHz, however, there is a rejection "notch" of approximately −40 dB. Specifically, the plot point M8 corresponding to the 4.8 GHz harmonic frequency shows a rejection of −38.506 dB, while the plot point M9 corresponding to the 5 GHz harmonic frequency shows a rejection of −40.993 dB.

The graph of FIG. 17B shows the noise figure/degradation of the signal-to-noise ratio, which at plot points M5 and M6 corresponding to the operating/fundamental frequency of 2.4 GHz to 2.5 GHz, is minimal (approximately 0.6 dB).

Figure 17C:
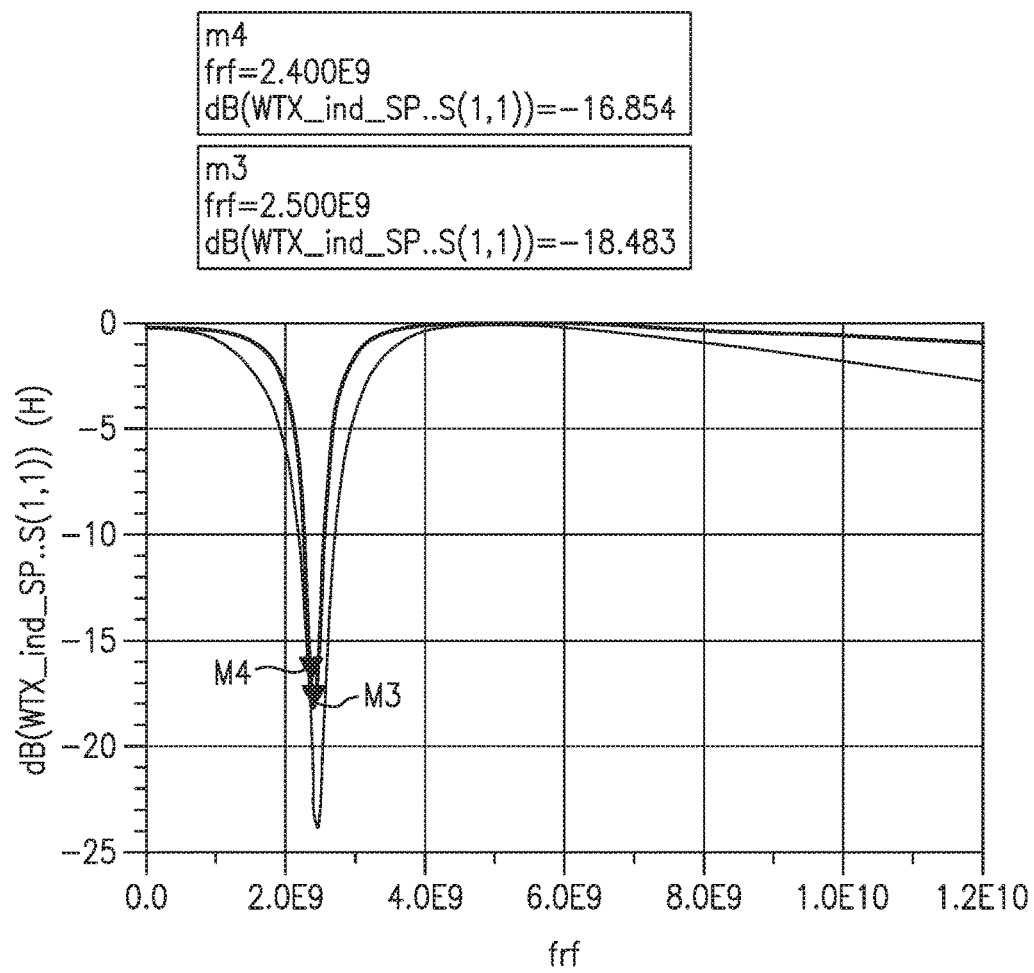
Figure 17D:
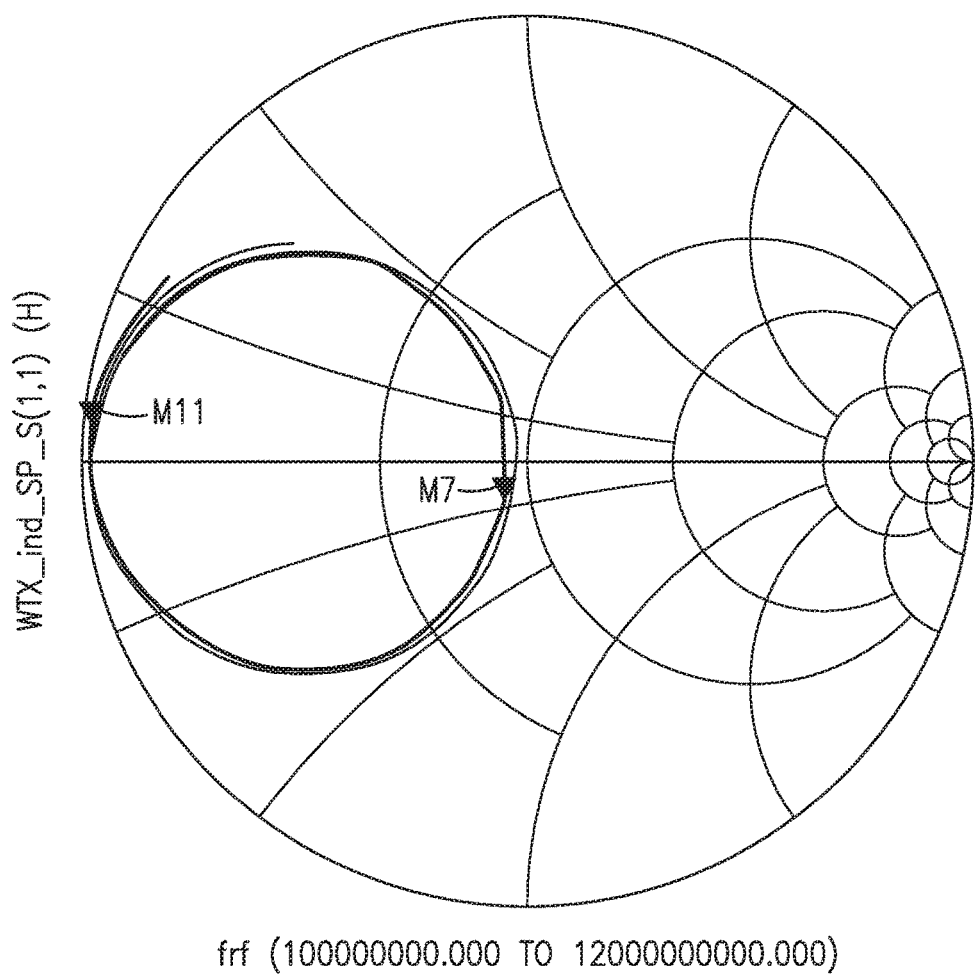

The graph of FIG. 17C plots the input return loss (S11), which at the operating frequency range of 2.4 GHz to 2.5 GHz, is between −16.854 and −18.483, indicating that the power amplifier circuit 66 is well matched. The Smith chart of FIG. 17D also plotting the input return loss (S11) further illustrates this. In comparison to the performance of the power amplifier circuit 66 described above in conjunction with FIG. 13, the slope/drop-off at the relevant frequencies of the power amplifier circuit 66 shown in FIG. 16 is steeper, albeit with a slight increase in insertion loss.

Figure 18:
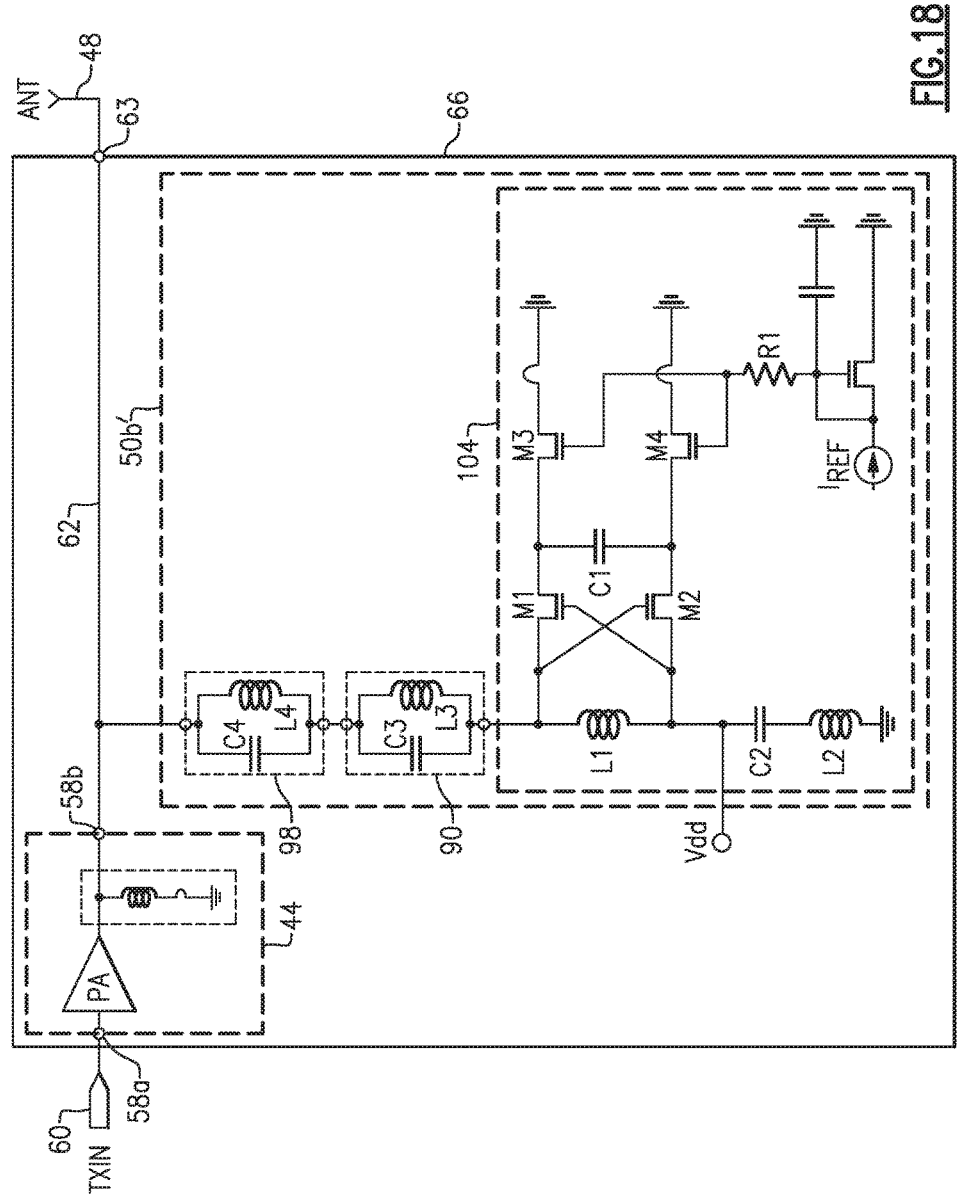
FIG. 18 is a schematic diagram of the radio frequency amplifier circuit including a variation of the second embodiment of the active harmonic filter implemented with the differential amplifier circuit.
Figure 19A:
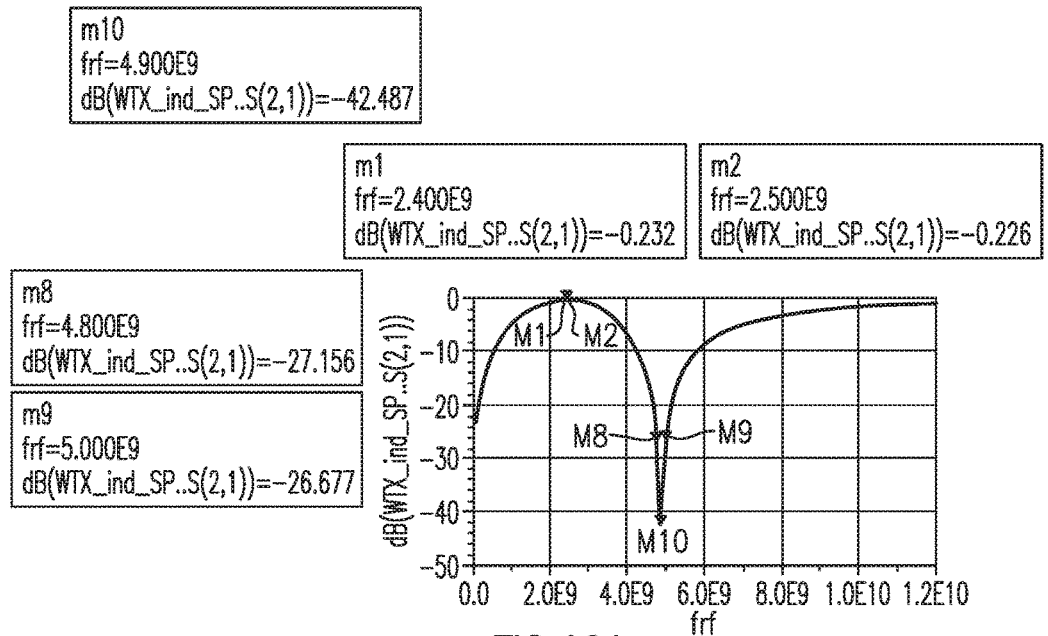
FIGS. 19A, 19B, 19C and 19D are graphs plotting the simulated performance of the radio frequency amplifier circuit shown in FIG. 18.
Figure 19B:
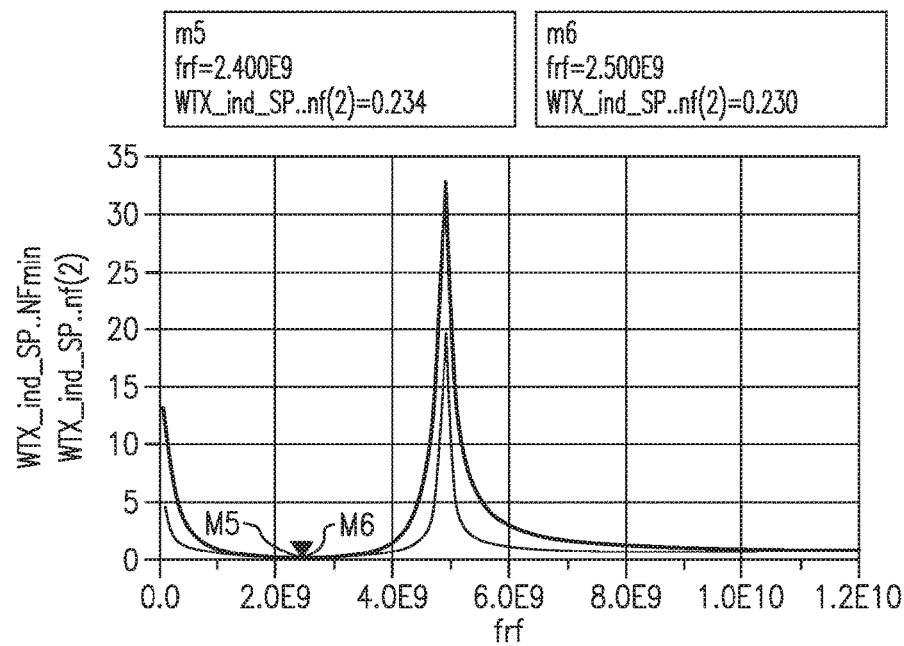

The schematic diagram of FIG. 18 depicts another variation of the power amplifier circuit 66 that includes the power amplifier 44 that is connected to the transmit signal source 60 at the input 58a, and the output 58b that is connected to the transmission line 62 to the antenna 48. In this implementation, there is a second variation of the active harmonic filter 50b' that includes the first tank circuit 90 and the differential amplifier circuit 104. Additionally, the second tank circuit 98 is connected to the first tank circuit 90, and in turn, the second tank circuit 98 is connected to the transmission line 62. Because the differential amplifier circuit 104 is understood to be configured and operate the same way as discussed above, for the sake of brevity, a repeated discussion of the configuration thereof will be omitted. By way of example, the inductor The graphs of FIGS. 19A-19B plot the simulated performance of the foregoing power amplifier circuit 66 as shown in FIG. 18 that has been configured for operating in the 2.4 GHz to 2.45 GHz ISM band. FIG. 19A shows the transmission insertion loss (S21) being minimal in the operating frequency range as indicated in plot points M1 and M1 at 2.4 GHz and 2.5 GHz, respectively. At the second harmonic of 5 GHz, however, there is a rejection "notch" of approximately −42 dB. The plot point M8 corresponds to a lower end of the range of harmonic frequencies that are rejected at 4.8 GHz, and at this point, the rejection is −27.156 dB. The plot point M9 corresponds to an upper end at 5 GHz, and the rejection is −26.677. At the center between these high and low ends is 4.9 GHz as designated by the plot point M10. The rejection at this frequency is −42.487 dB.

The graph of FIG. 19B shows the noise figure/degradation of the signal-to-noise ratio, which at plot points M5 and M6 corresponding to the operating/fundamental frequency of 2.4 GHz to 2.5 GHz, is minimal at approximately 0.2 dB.

Figure 19C:
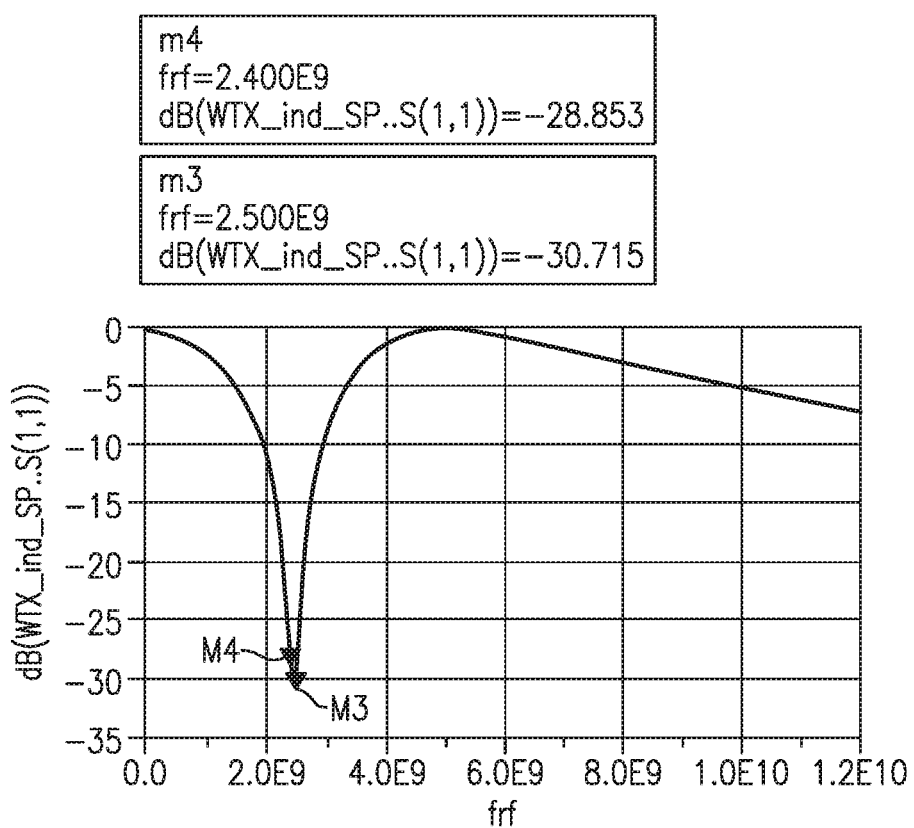
Figure 19D:
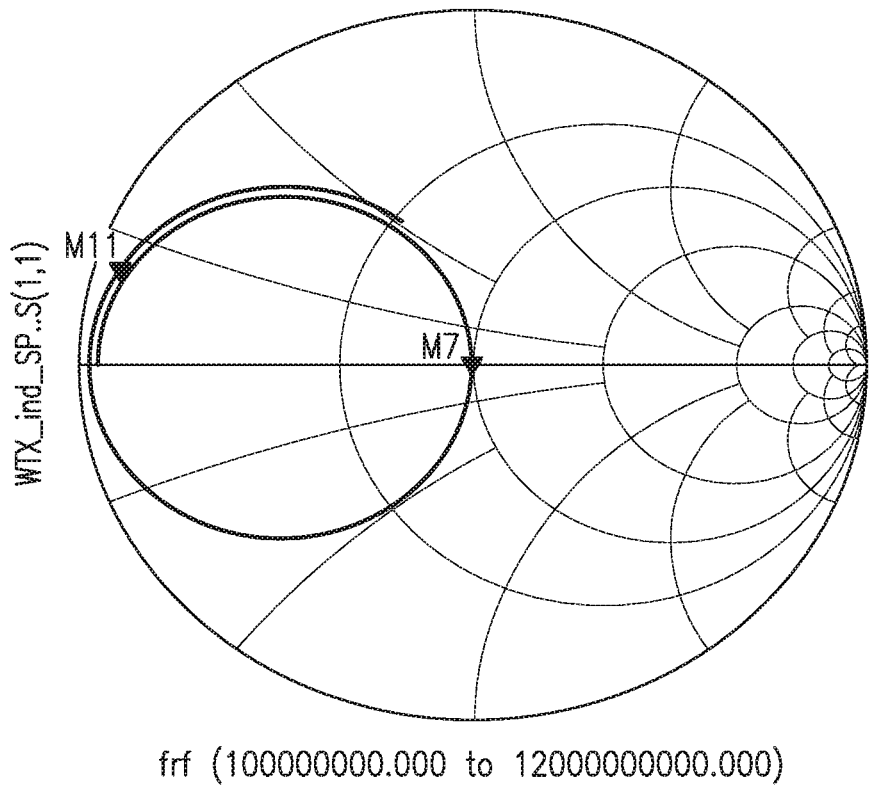

The graph of FIG. 19C plots the input return loss (S11), which at the operating frequency range of 2.4 GHz to 2.5 GHz, is between −28.853 and −30.715. The Smith chart of FIG. 17D also plotting the input return loss (S11) shows that the power amplifier circuit 66 is matched to the antenna 48. In comparison to the performance of the power amplifier circuit 66 described above in conjunction with FIGS. 13 and 16, insertion loss is reduced, while other performance parameters are the same.

Figure 20:
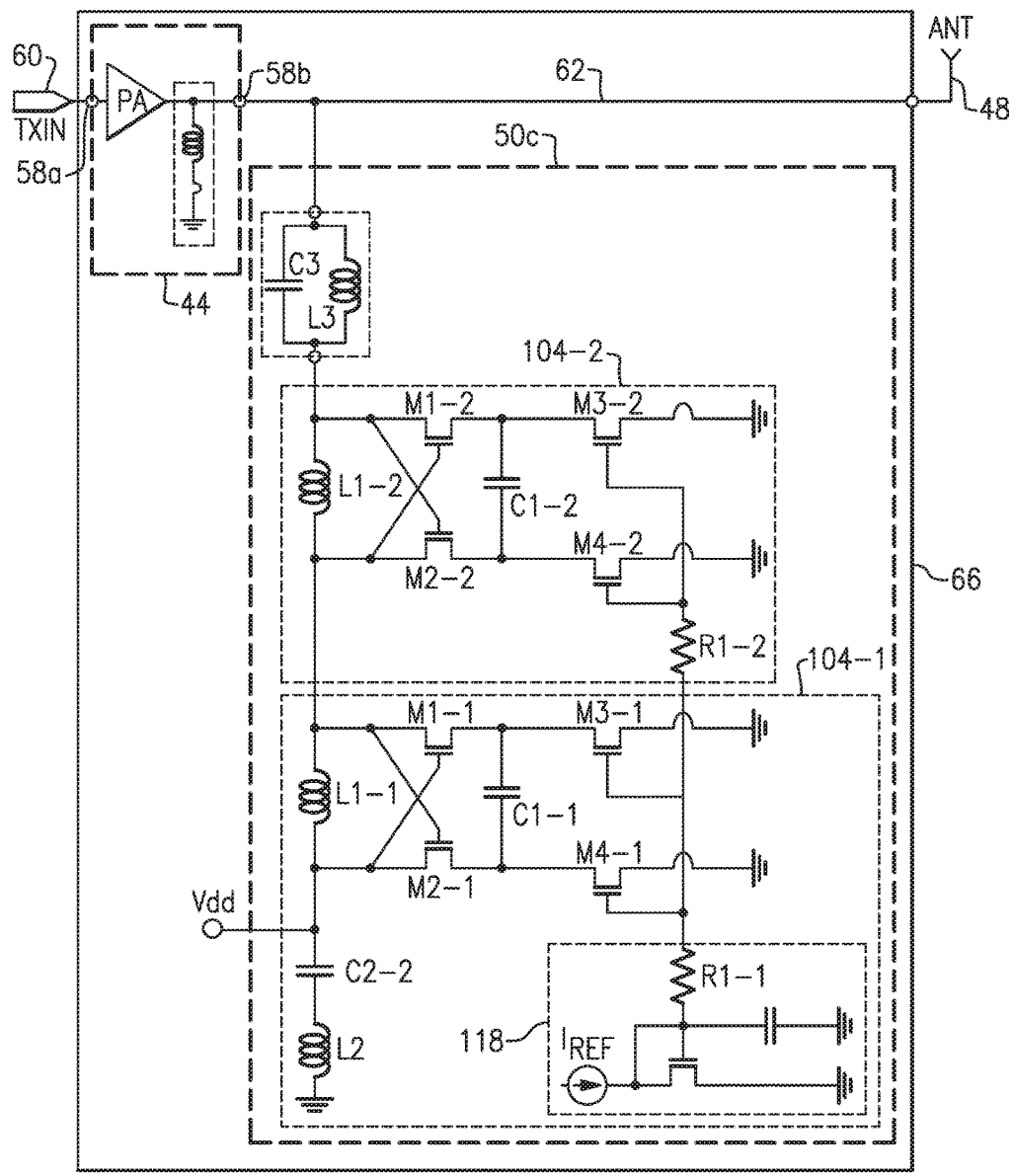
FIG. 20 is a schematic diagram of the radio frequency amplifier circuit including yet another variation of the second embodiment of the active harmonic filter with two cascaded differential amplifier circuits.

Referring to the schematic diagram of FIG. 20, the power amplifier circuit 66 again includes the power amplifier 44 that is connected to the transmit signal source 60 at the input 58a, and the output 58b that is connected to the transmission line 62 to the antenna 48. A third embodiment of the active harmonic filter 50c is contemplated, which includes a first instance of the differential amplifier circuit 104-1 and a second instance of the differential amplifier circuit 104-2. The first instance of the differential amplifier circuit 104-1 is connected to the second instance of the differential amplifier circuit 104-2, which in turn is connected to the first tank circuit 90. In further detail, the junction 114-1 defined in the first instance of the differential amplifier circuit 104-1 is connected to the junction 116-2 defined in the second instance of the differential amplifier circuit 104-2. Additionally, both the first instance of the differential amplifier circuit 104-1 and the second instance of the differential amplifier circuit 104-2 share a common bias setting circuit 118, which is connected to the gates of the transistors M3-1 and M4-1 of the first instance of the differential amplifier circuit 104-2, as well as the transistors M3-2 and M4-2 of the second instance of the differential amplifier circuit 104-2. Likewise, there is one voltage source VDD that is connected to the junction 116-1 of the first instance of the differential amplifier circuit 104-1, and one DC-decoupling capacitor C2 in series with the bond wire of L2.

The first instance of the differential amplifier circuit 104-1 and the second instance of the differential amplifier circuit 104-2 are understood to be configured and operate the same way as discussed above in relation to the differential amplifier circuit 104. As such, a discussion on the configuration of such subparts of the differential amplifier circuits 104-1 and 104-2 will be omitted for the sake of brevity.

Figure 21A:
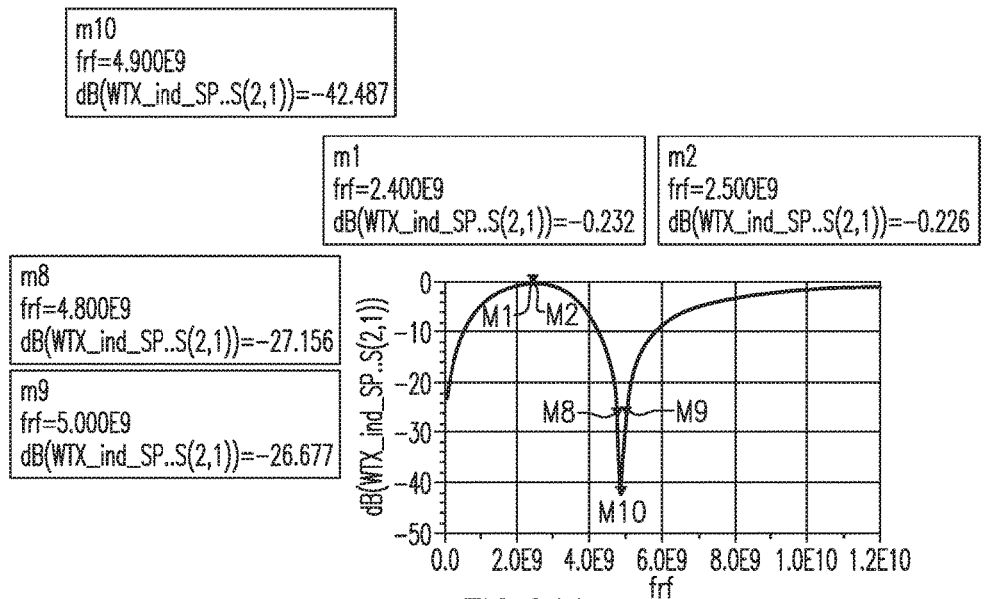
FIGS. 21A, 21B, 21C and 21D are graphs plotting the simulated performance of the radio frequency amplifier circuit shown in FIG. 20.
Figure 21B:
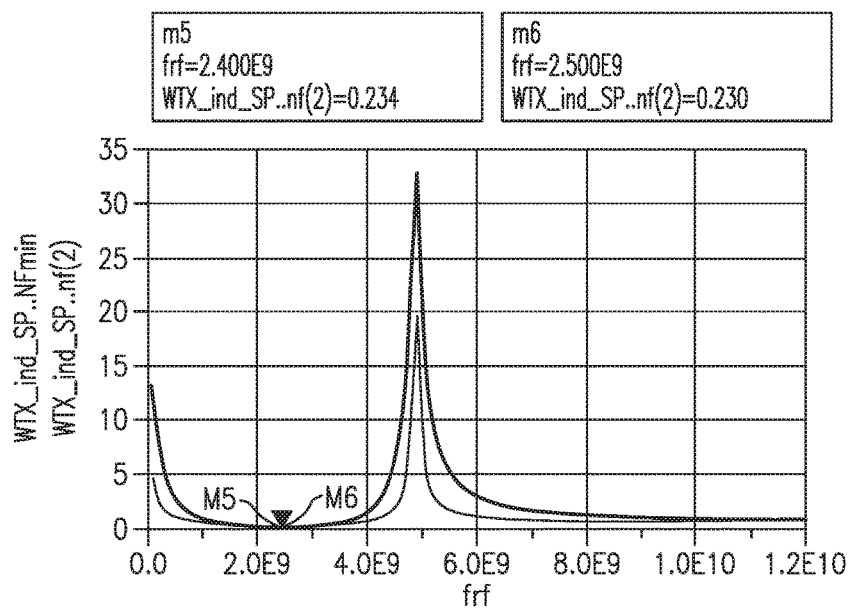

The graphs of FIGS. 21A-21B plot the simulated performance of the foregoing power amplifier circuit 66 as shown in FIG. 20 that has been configured for operating in the 2.4 GHz to 2.45 GHz ISM band. FIG. 21A shows the transmission insertion loss (S21) being minimal in the operating frequency range as indicated in plot points M1 and M1 at 2.4 GHz and 2.5 GHz, respectively. At the second harmonic of 5 GHz, there is a rejection "notch" of over −40 dB. Specifically, the plot point M8 corresponding to the 4.8 GHz harmonic frequency shows a rejection of −27.156 dB, while the plot point M9 corresponding to the 5 GHz harmonic frequency shows a rejection of −26.677 dB. Additionally, at 4.9 GHz, per plot point M10, there is a rejection of −42.487 dB. In comparison to the performance of the power amplifier circuit 66 described above, this variation has a higher harmonics rejection characteristic.

Similar to the above, the graph of FIG. 21B shows the noise figure/degradation of the signal-to-noise ratio, which at plot points M5 and M6 corresponding to the operating/fundamental frequency of 2.4 GHz to 2.5 GHz, is minimal (approximately 0.2 dB).

Figure 21C:
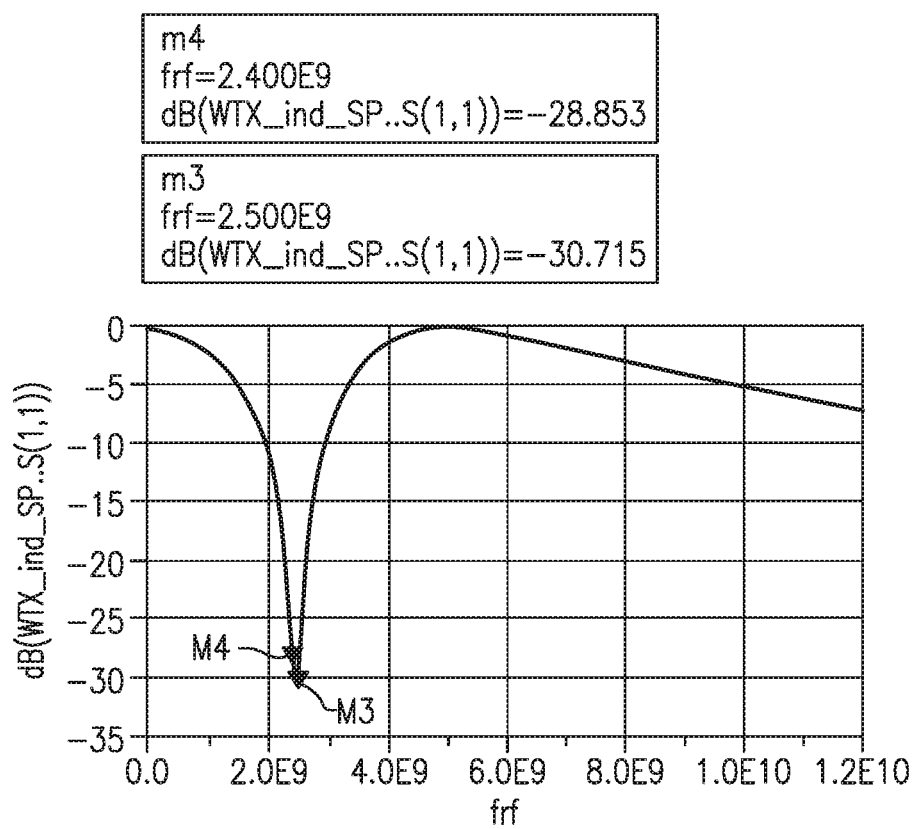
Figure 21D:
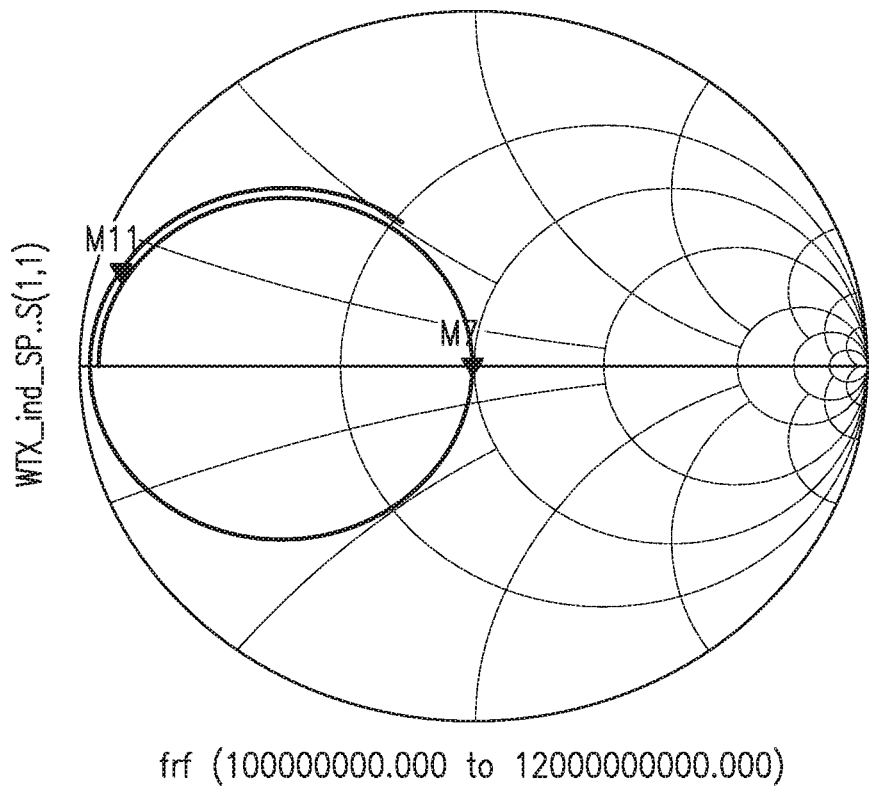

The graph of FIG. 21C plots the input return loss (S11), which at the operating frequency range of 2.4 GHz to 2.5 GHz, is between −28.853 and −30.815 indicating that the power amplifier circuit 66 is well matched. The Smith chart of FIG. 21D also plotting the input return loss (S11) further illustrates this.

Figure 22A:
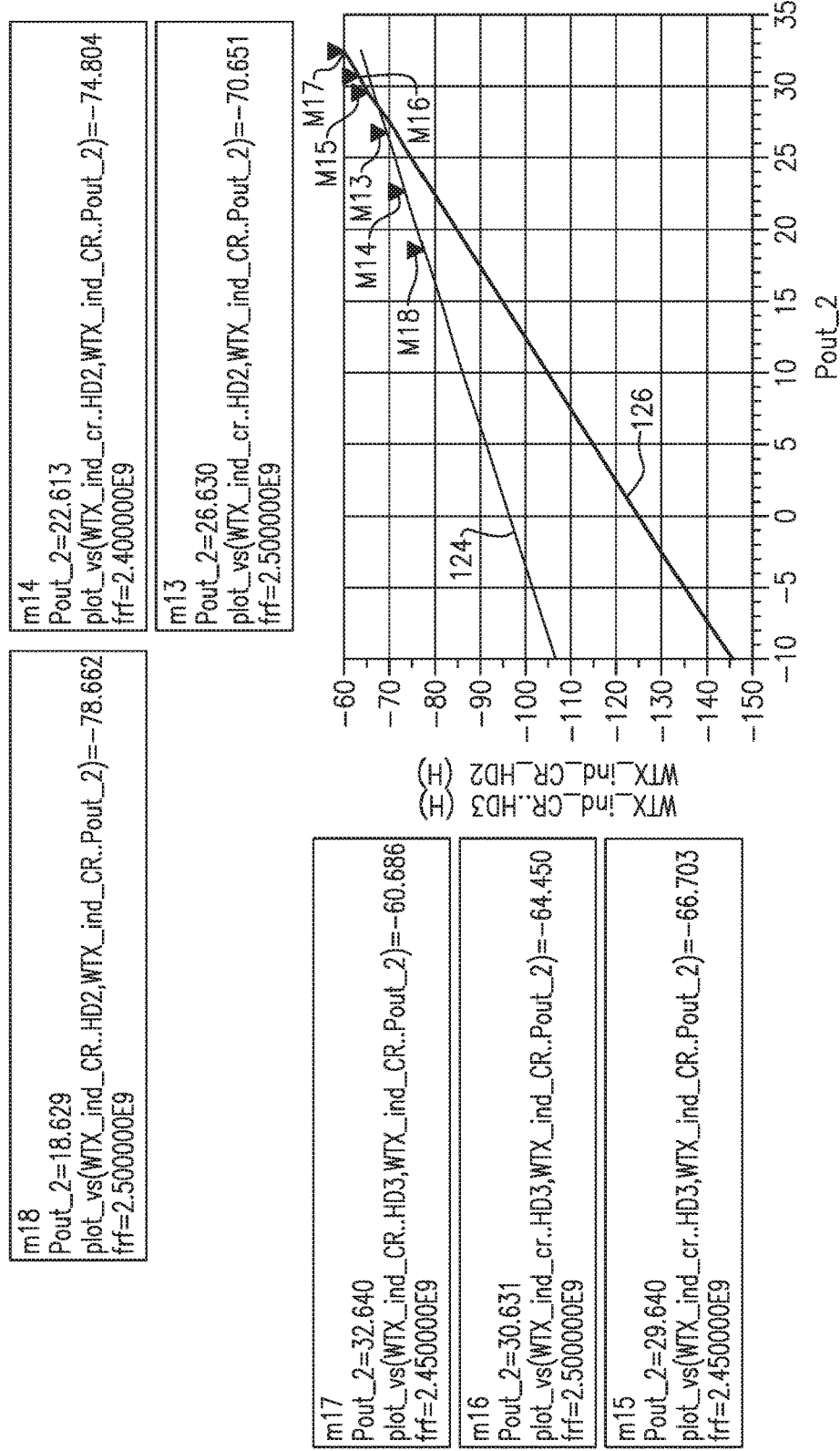
FIGS. 22A and 22B are graphs plotting the harmonics power components along simulated single tone power sweeps of the radio frequency amplifier circuit shown in FIG. 20.
Figure 22B:
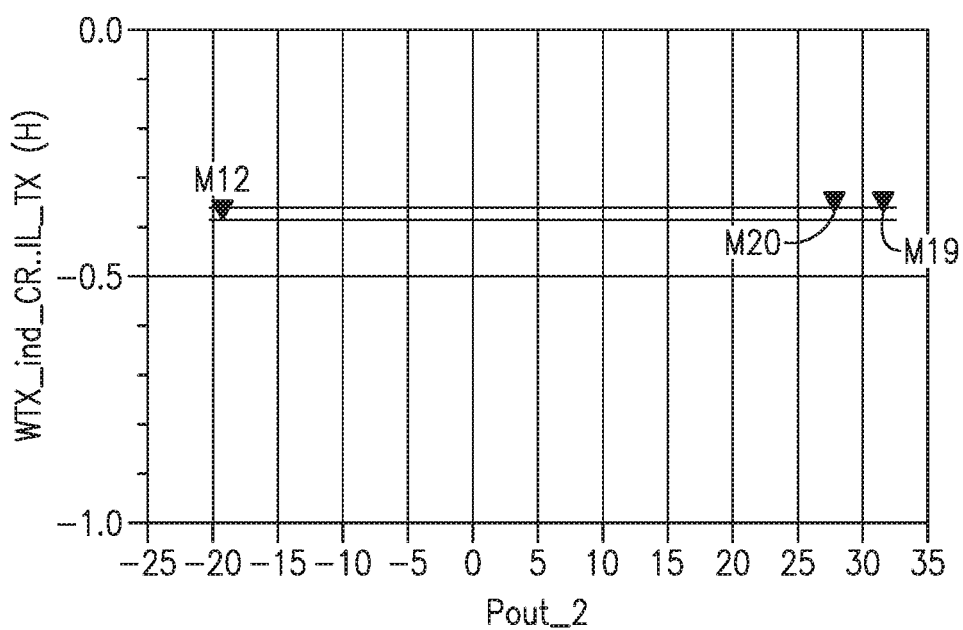

FIGS. 22A and 22B plot the simulated power sweep with a single tone signal of the power amplifier circuit 66 with the third embodiment of the active harmonic filter 50c. The graph of FIG. 22A in particular includes a plot 124 for the second harmonic, as well as a plot 126 for the third harmonic. The graph of FIG. 22B plots the gain compression at different output power levels of the fundamental operating frequency of 2.4 GHz, 2.45 GHz, and 2.5 GHz. Plot point M12 corresponds to an output power level of −19.386 dBm at the 2.4 GHz operating frequency, plot point 19 corresponds to an output power level of 31.640 dBm at the 2.45 GHz operating frequency, and plot point M20 corresponds to an output power level of −27.630 dBm at the 2.5 GHz operating frequency.

Figure 23:
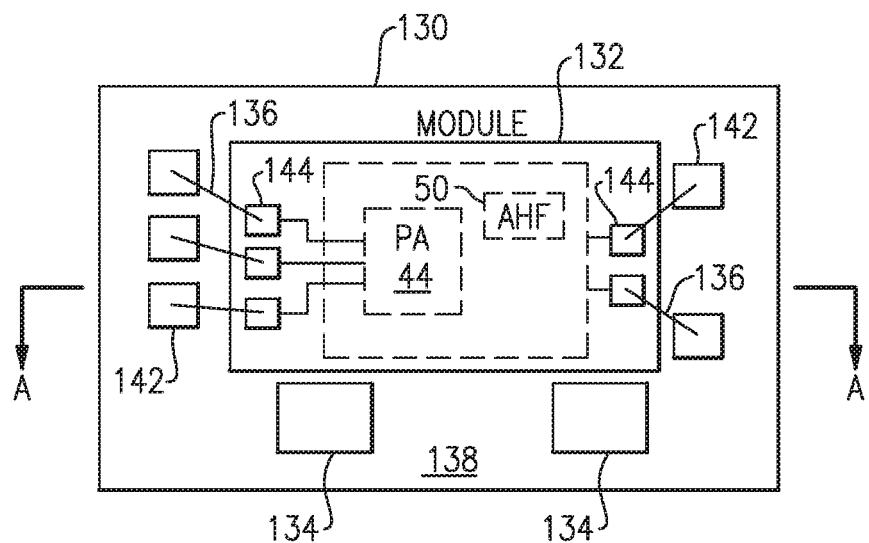
FIG. 23 is a schematic diagram of a packaged amplifier module.
Figure 24:
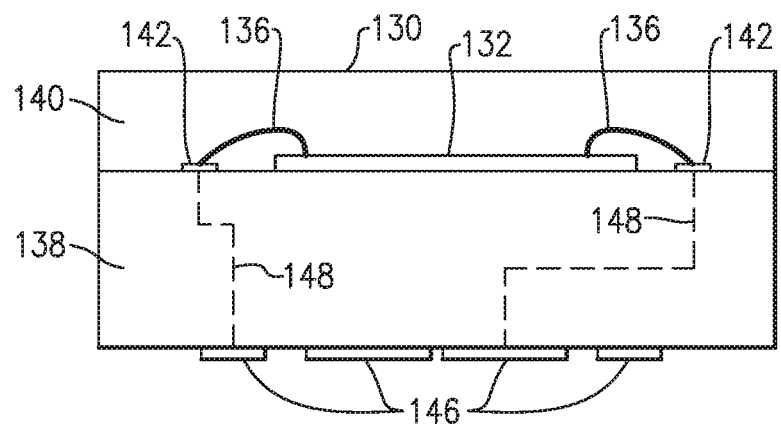
FIG. 24 is a schematic diagram of a cross-section of the packaged amplifier module shown in FIG. 23.

FIG. 23 is a schematic diagram of an embodiment of a packaged radio frequency communications module 130, while FIG. 24 is a schematic diagram of a cross-section of the packaged radio frequency communications module 130 taken along axis A-A of FIG. 23. The packaged radio frequency communications module 130 includes an integrated circuit or die 132, surface mount components 134, wire bonds 136, a package substrate 138, and an encapsulation structure 140. The package substrate 138 includes pads 142 formed from conductors disposed therein. Additionally, the die 132 includes pads 144, and the wire bonds 136 are used to electrically connect the pads 144 of the die 132 to the pads 142 of the package substrate 138.

The die 132 includes the power amplifier 44 and the active harmonic filter 50 of the present disclosure formed therein. These components on the die 202 are understood to be as described above. Again, it is expressly contemplated that the active harmonic filter 50 is fabricated on the same die as the power amplifier 44 so as to avoid the need for an externally connected filter circuit. However, this is exemplary only, and other embodiments also contemplate connecting an suitably configured active harmonic filter 50 according to the present disclosure, but implemented as a separate circuit external to the die 132.

The die 132 is mounted to the package substrate 138 as shown, though it may be configured to receive a plurality of additional components such as the surface mount components 134. These components include additional integrated circuits as well as passive components such as capacitors, inductors, and resistors.

As shown in FIG. 23, the packaged radio frequency communications module 130 is shown to include a plurality of contact pads 146 disposed on the side of the packaged radio frequency communications module 130 opposite the side used to mount the die 132. Configuring the packaged radio frequency communications module 130 in this manner can aid in connecting the same to a circuit board of the wireless communications device 10. The example contact pads 146 can be configured to provide radio frequency signals, bias signals, power low voltage(s) and or power high voltage(s) to the die 132 and/or the surface mount components 134. The electrical connections between the contact pads 146 and the die 132 can be facilitated by connections 148 through the package substrate 138. The connections 148 can represent electrical paths formed through the package substrate 138, such as connections associated with vias and conductors of a multilayer laminated package substrate.

In some embodiments, the packaged radio frequency communications module 130 can also include or more packaging structures to, for example, provide protection and/or to facilitate handling of the packaged radio frequency communications module 130. Such a packaging structure can include overmold or encapsulation structure 140 formed over the package substrate 138 and the components and die(s) disposed thereon.

It will be understood that although the packaged radio frequency communications module 130 is described in the context of electrical connections based on wire bonds, one or more features of the present disclosure can also be implemented in other packaging configurations, including, for example, flip-chip configurations.

By utilizing the various embodiments of the active harmonic filter 50 in the power amplifier circuits 66, elimination of external filters is possible, thereby reducing cost, printed circuit board footprint, and losses associated with the interconnections needed with an external component. Furthermore, as illustrated above, the active harmonic filters 50 are understood to consume little power, as the supply (VDD) can be 1.8 V and as low as 1 V, and quiescent current through the circuit may be as low as 200 µA to 700 µA. Moreover, the active harmonic filters 50 have large power handling capability but with low added distortion, and thus may be suited for highly linear RF power amplifier circuits such as those utilized in the latest wireless communications modalities such as IEEE 802.11ac. In comparison to passive trap circuits, the presently disclosed active harmonic filters 50 exhibit less loss, and higher suppression of harmonics.

The particulars shown herein are by way of example and for purposes of illustrative discussion of the embodiments of the active harmonic circuits and RF amplifiers incorporating the same, and are presented in the cause of providing what is believed to be the most useful and readily understood description of the principles and conceptual aspects. No attempt is made to show details with more particularity than is necessary, the description taken with the drawings making apparent to those skilled in the art how the several forms of the present disclosure may be embodied in practice.

What is claimed is:

1. An active filter connectible to an amplifier for reducing harmonics of a signal being amplified thereby, the active filter comprising:
a single port connectible to the amplifier;
a first differential amplifier circuit defining a first negative capacitance at a first predetermined operating frequency range and including a first pair of transistors and a second pair of transistors, each transistor in the first pair being connected to a respective one of the transistors in the second pair to define a corresponding inverting differential circuit segment and a non-inverting differential circuit segment, the inverting differential circuit segment and the non-inverting differential segment being interconnected with one or more passive circuit elements at corresponding circuit junctions, with at least one of the circuit junctions connected to the single port; and
a first tank circuit having a first port connectible to the amplifier and a second port connected to the single port, the first tank circuit together with the first negative capacitance of the first differential amplifier defining a first harmonic trap for reflecting the harmonics of the signal to block upstream passage thereof.

2. The active filter of claim 1 wherein the one or more passive circuit elements includes a first capacitor interconnecting the inverting differential circuit segment to the non-inverting differential circuit segment at respective junctions between the corresponding transistor of the first pair and the transistor of the second pair.

3. The active filter of claim 2 wherein the one or more passive circuit elements includes a first inductor interconnecting the inverting differential circuit segment and the non-inverting differential circuit segment at the circuit junction corresponding to the single port of the first differential amplifier circuit.

4. The active filter of claim 1 wherein the first differential amplifier circuit includes a bias setting circuit connected to the inverting differential circuit segment and the non-inverting differential circuit segment of the first differential amplifier circuit.

5. The active filter of claim 1 wherein the non-inverting differential circuit segment of the first differential amplifier circuit is connected to a supply voltage.

6. The active filter of claim 1 further comprising a second differential amplifier circuit defining a second negative capacitance at a second predetermined operating frequency range and including a first pair of transistors and a second pair of transistors, each transistor in the first pair being connected to a respective one of the transistors in the second pair to define a corresponding inverting differential circuit segment and a non-inverting differential circuit segment, the inverting differential circuit segment and the non-inverting differential segment being interconnected with one or more passive circuit elements at corresponding circuit junctions, with at least one of the circuit junctions defining a single port of the second differential amplifier circuit.

7. The active filter of claim 6 further comprising a second tank circuit having a first port connectible to the amplifier and a second port connected to the single port of the second differential amplifier circuit.

8. The active filter circuit of claim 7 wherein the second tank circuit together with the second negative capacitance of the second differential amplifier defines a second harmonic trap for reflecting the harmonics of the signal to block upstream passage thereof.

9. The active filter of claim 6 wherein single port of the second differential amplifier circuit is connected to the first differential amplifier circuit.

10. The active filter of claim 9 wherein the first tank circuit together with the first negative capacitance of the first differential amplifier and the second negative capacitance of the second differential amplifier define the first harmonic trap.

11. The active filter of claim 9 wherein the first differential amplifier circuit and the second differential amplifier circuit includes a shared bias setting circuit connected to the respective inverting differential circuit segments and the non-inverting differential circuit segments of each of the first differential amplifier circuit and the second differential amplifier circuit.

12. The active filter of claim 6 wherein the first predetermined operating frequency range and the second predetermined operating frequency range overlap.

13. The active filter of claim 1 further comprising a second tank circuit having a first port connectible to the amplifier and a second port connected to the first port of the first tank circuit.

14. The active filter of claim 13 wherein the first tank circuit and the second tank circuit together with the first negative capacitance of the first differential amplifier define the first harmonic trap.

15. An active filter connectible to an amplifier for reducing harmonics of a signal being amplified thereby, the active filter comprising:
a single port connectible to the amplifier;
a first differential amplifier circuit defining a first negative capacitance at a first predetermined operating frequency range and including an inverting differential circuit segment and a non-inverting differential circuit segment interconnected with one or more passive circuit elements at corresponding circuit junctions, one of the circuit junctions being connected to the single port; and
a first tank circuit having a first port connectible to the amplifier and a second port connected to the single port, the first tank circuit together with the first negative capacitance of the first differential amplifier defining a first harmonic trap for reflecting the harmonics of the signal to block upstream passage thereof.

16. The active filter of claim 15 wherein the first differential amplifier circuit includes a bias setting circuit connected to the inverting differential circuit segment and the non-inverting differential circuit segment of the first differential amplifier circuit.

17. The active filter of claim 15 wherein the non-inverting differential circuit segment of the first differential amplifier circuit is connected to a supply voltage.

18. The active filter of claim 15 further comprising a second differential amplifier circuit defining a second negative capacitance at a second predetermined operating frequency range and including an inverting differential circuit segment and a non-inverting differential circuit segment, the inverting differential circuit segment and the non-inverting differential segment being interconnected with one or more passive circuit elements at corresponding circuit junctions, with at least one of the circuit junctions defining a single port of the second differential amplifier circuit.

19. The active filter of claim 18 further comprising a second tank circuit having a first port connectible to the amplifier and a second port connected to the single port of the second differential amplifier circuit.

20. The active filter of claim 19 wherein single port of the second differential amplifier circuit is connected to the first differential amplifier circuit.

21. The active filter of claim 18 wherein the first predetermined operating frequency range and the second predetermined operating frequency range overlap.

* * * * *